(12) United States Patent
Okada et al.

(10) Patent No.: US 7,307,297 B2
(45) Date of Patent: Dec. 11, 2007

(54) ORGANIC PHOTODIODE AND METHOD FOR MANUFACTURING THE ORGANIC PHOTODIODE

(75) Inventors: Hiroyuki Okada, Toyama (JP); Shigeki Naka, Toyama (JP); Hiroyoshi Onnagawa, Toyama (JP); Takeshi Miyabayashi, Komaki (JP); Toyokazu Inoue, Nagoya (JP)

(73) Assignees: Japan Science and Technology Agency, Kawaguchi (JP); National University Corporation Toyama University, Toyama (JP); Brother Kogyo Kabushiki Kaisha, Nagoya (JP)

( * ) Notice: Subject to any disclaimer, the term of this patent is extended or adjusted under 35 U.S.C. 154(b) by 38 days.

(21) Appl. No.: 11/213,787

(22) Filed: Aug. 30, 2005

(65) Prior Publication Data
US 2006/0186400 A1 Aug. 24, 2006

(30) Foreign Application Priority Data
Feb. 10, 2005 (JP) ............................. 2005-034690

(51) Int. Cl.
*H01L 27/148* (2006.01)
(52) U.S. Cl. ..................... 257/233; 257/40; 257/292; 438/48
(58) Field of Classification Search ................ 257/40, 257/233, 109, 280, 281, 282, 283, 284, 285, 257/286, 287, 288, 289
See application file for complete search history.

(56) References Cited

U.S. PATENT DOCUMENTS 6,025,857 A * 2/2000 Obata et al. ................ 347/120
6,388,377 B1 5/2002 Kobayashi et al.
6,424,418 B2 * 7/2002 Kawabata et al. .......... 356/445
6,849,308 B1 * 2/2005 Speakman et al. .......... 427/595
7,122,283 B2 * 10/2006 Qi et al. ..................... 430/58.2
2002/0017612 A1 * 2/2002 Yu et al. ................. 250/370.11
2004/0012016 A1 * 1/2004 Underwood et al. .......... 257/40
2004/0056180 A1 * 3/2004 Yu .......................... 250/214.1
2005/0019976 A1 * 1/2005 Xiao et al. ..................... 438/99
2006/0105492 A1 * 5/2006 Veres et al. .................. 438/99

FOREIGN PATENT DOCUMENTS

| JP | A 5-335541 | 12/1993 |
| JP | A 10-12377 | 1/1998 |
| JP | A 11-87063 | 3/1999 |

OTHER PUBLICATIONS

Yanagi et al., "Self-Aligned Photo Sensing Devices Obtained Using Ink-Jet Printing Method," Extended Abstracts (The 65th Autumn Meeting 2004); The Japan Society of Applied Physics, Sep. 2004 with partial translation.

* cited by examiner

*Primary Examiner*—Kiesha L. Rose
*Assistant Examiner*—Swapneel Chhaya
(74) *Attorney, Agent, or Firm*—Oliff & Berridge PLC

(57) ABSTRACT

In an organic photodiode, in a gap between a transparent anode formed on a glass substrate, and a reflection cathode formed oppositely thereto, a plurality of light receiving parts as layers of light absorbing composition, and partition walls for insulating between transparent anode and reflection cathode and insulating between adjacent light receiving parts are formed. Partition walls are formed by applying an ink solution to transparent anode and an insulating layer covering its periphery, dissolving the insulating layer by an organic solvent contained in the ink solution, and forming a plurality of dissolved holes contacting with transparent anode. The plurality of light receiving parts are formed by filling the plurality of dissolved holes with the light absorbing composition contained in the ink solution.

24 Claims, 20 Drawing Sheets

FIG. 2A

| Condensation code | Legal name | Photoconductivity |
|---|---|---|
| (ppy)₂Ir(acac) | bis(2-phenylpyridine)iridium(III) acetylacetonate | x |
| 2PSP | 1,2-bis(1-methyl-2,3,4,5-tetraphenylsilacyclopentadienyl)ethane | x |
| 6P | para-sexiphenyl | x |
| Al(5Fla)3 | tris(5-hydroxyflavonate)aluminum | x |
| Almq₃ | tris(4-methyl-8-hydroxyquinoline)aluminum | x |
| Alq'2OPh | bis-(8-hydroxy)quinaldine aluminum phenoxide | x |
| Alq₃ | tris-(8-hydroxyquinoline)alminum | x |
| Alq₃ | tris-(8-hydroxyquinoline)alminum | x |
| Alq₃ | tris-(8-hydroxyquinoline)alminum | x |
| α-NPD | 4,4'-bis[N-(1-naphtyl)-N-phenyl-amino)biphenyl | x |
| α-NPD | 4,4'-bis[N-(1-naphtyl)-N-phenyl-amino)biphenyl | x |
| α-NPD | 4,4'-bis[N-(1-naphtyl)-N-phenyl-amino)biphenyl | x |
| BAlq | bis(2-methyl-8-quinolinolato)(p-phenylphenolato) aluminum | x |
| BBOT | 2,5-bis(5-tert-butyl-2-benzoxazolyl)thiophen | x |
| BCP | 2,9-dimethyl-4,7-diphenyl-1,10-phenanthroline | x |
| BCP | 2,9-dimethyl-4,7-diphenyl-1,10-phenanthroline | x |
| Be(5Fla)2 | bis(5-hydroxyflavonate)beryllium | x |
| BeBq₂ | Bis(10-hydroxybenzo[h]quinolinate)beryllium | x |
| BND | 2,5-bis(1-naphtyl)-1,3,4-oxadiazole | x |
| BPPC | N,N'-bis(2,5-di-tert-butylphenyl)-3,4,9,10-perylenedicarboximide | O |
| BSA-1 | 9,10-bis(4-cyanostyryl)anthracene | x |
| Bt2Ir(acac) | bis(2-phenylbenzothiozolate-N,C²')iridium(acetylacetonate) | x |
| Btp2Ir(acac) | bis(2-(2'-benzo[4,5-a]thenyl)pyridinate-N,C³')iridium(acetylacetonate) | x |
| BTX-1 | benzothioxanthene | x |
| C60 | Fullerene | O |
| CBP | 4,4'-bis(N-carbazolyl)biphenyl | x |
| CBP | 4,4'-bis(N-carbazolyl)biphenyl | x |
| CCP | 1,4-bis(carbazolyl)benzen | x |
| CuPc | copper phthalocyanine | O |
| DCJTB | 4-dicyanomethylene-6-cp-julolidinostyryl-2-tert-butyl-4H-pyran | x |
| DCM | 4-(dicyanomethylene)-2-methyl-6-(p-dimethylaminostyryl)-4H-pyran | x |
| DCTA | 4,4'-di(N-carbazolyl)tri-phenylamine | x |
| DPA | diphenyl anthracene | x |
| DPAN | 2-diphenylaminoanthracene | x |
| DSTPA | distyryl compound. | x |
| Eu(DBM)3(Phen) | tris(1,3-diphenyl-1,3-propanediono) (monophenanthroline)europium | x |
| F16CuPc | copper(II) 1,2,3,4,8,9,10,11,15,16,17,18,22,23,24,25-hexadecafluoro-29H,31H-phthalocyanine | O |
| FIrN4 | iridium(III) bis(4,6-difluorophenylpyridinato)-5-(pyridin-2-yl)-1H-tetrazolate | x |
| FIrpic | iridium(III)bis(4,6-di-fluorophenyl)-pyridinato-N,C²')picolinate | x |
| HMTPD | 4,4'-bis[N,N'-(3-tolyl)amino]-3,3'-dimethylbiphenyl | x |
| Ir(DPF)₃ | tris[9,9-dihexyl-2-(pyridinyl-2')fluorene] iridium (III) | x |
| Ir(ppy)₃ | fac tris(2-phenylpyridine) iridium | x |
| MAB | boryl anthracene derivative | x |
| mCP | 1,3-bis(9-carbazolyl)benzene | x |
| MEH-PPV | 2-methoxy, 5-(2'-ethyl-hexyloxy)-1,4-phenylene vinylene | O |
| m-MTDATA | 4,4',4"-tris(3-methylphenylamino)triphenylamine | x |

FIG. 2B

| Condensation code | Legal name | Photoconductivity |
|---|---|---|
| Nile red | Phenoxazone | x |
| Nile red | Phenoxazone | x |
| OXD7 | 1,3-bis[(4-tert-butylphenyl)-1,3,4-oxadiazolyl]phenylene | x |
| PbPc | Lead phthalocyanine | x |
| p-DPA-TDAB | 1,3,5-tris[N-(4-diphenylaminophenyl)phenylamino]benzene | x |
| pentacene | pentacene | x |
| PPR | 4-[2-[5-[4-(Diethylamino)phenyl]-4,5-dihydro-1-phenyl-1H-pyrazol-3-yl]-ethenyl]-N,N-diethylaniline | O |
| PPV | poly(p-phenylene vinylene) | x |
| PTCBI | perylene tetracarboxylic derivative | O |
| PtOEP | 2,3,7,8,12,13,17,18-octaethyl-21H,23H-porphine platinum(II) | x |
| PtOX | 2,8,12,17-tetraetyl-3,7,13,18-tetramethylporphyrin | x |
| p-TTA | tri(p-terphenyl-4-yl)amine | x |
| PVCz | poly(N-vinylcarbazole) | x |
| PVCz | poly(N-vinylcarbazole) | x |
| PyPySPyPy | 2,5-bis(6'-(2'-2"-bipyridyl))-1,1-dimethyl-3,4-diphenylsilole | O |
| PYR-D1 | pyrazoline derivative | O |
| rubrene | 5,6,11,12-tetraphenylnaphthacene | O |
| SAlq | bis(2-methyl-8-quinolinate)(triphenylsilanolate)aluminum(III) | x |
| SimCP | s,5-bis(9-carbazolyl)tetraphenylsilan | x |
| Spiro-4φ | 2,2'4,4'-tetraphenyl-9,9'-spiro-bifluorene | x |
| Spiro-Octo | 2,2',4,4',7,7'-hexakis-(4-biphenyl)-9,9'-spiro-bifluorene | x |
| Spiro-TAD | 2,2'7,7'-tetra-kis-(diphenylamino)-9,9'-spiro-bifluorene | x |
| TAPC | 1,1-bis(4-tolylaminophenyl) cyclohexane | x |
| TAZ | 3-phenyl-4-(1'-naphthyl)-5-phenyl-1,2,4-triazole | x |
| tBu-PBD | 2-(4-biphynylyl)-5-(4-tert-butylphenyl)1,3,4-oxadiazole | x |
| TCTA | 4,4',4"-tris(N-carbazolyl)triphenylamine | x |
| TCTA | 4,4',4"-tris(N-carbazolyl)triphenylamine | x |
| TDAPTz | 1,3,5-tris(4-diphenylaminophenyl)triazine | x |
| td-PTC | ditridecyl perylenetetracarboxylic diimide | O |
| TPAN | 1,5,9,10-tetraphenyl-anthracene | x |
| TPB | 1,1,4,4-tetraphynyl-1,3-butadiene | x |
| TPBI | 1,3,5-tris[2-N-phenylbenzimidazolyl)benzene | x |
| TPBI | 1,3,5-tris[2-N-phenylbenzimidazolyl)benzene | x |
| TPCP | 1,2,3,4-tetraphenyl-1,3-cyclopentadiene | x |
| TPD | N,N'-bis(3-methylphenyl)-(1,1'-biphenyl)4,4'-diamine | x |
| TPD | N,N'-bis(3-methylphenyl)-(1,1'-biphenyl)4,4'-diamine | x |
| TPD | N,N'-bis(3-methylphenyl)-(1,1'-biphenyl)4,4'-diamine | x |
| TPP | 5,10,15,20-tetraphenyl-21H,23H-porhine | O |
| TPTE | triphenylamine tetramer | x |
| TTBND | N,N,N',N'-tetra(p-tolyl)-3,3'-dimethyl-1,1'-binaphthalene-4,4'-diamine | x |
| Zn(3Fla)2 | bis(3-hydroxyflavonate)zinc | x |
| Zn(5Fla)2 | bis(5-hydroxyflavonate)zinc | x |

FIG. 3

| material | chloroform | tetrahydrofuran | tetralin | 1,2-dichloroethane | ethyl lactate | mesitylene |
|---|---|---|---|---|---|---|
| Alq3 | × | × | × | × | | |
| BCP | ○ | × | ○ | △ | × | |
| BND | ○ | ○ | ○ | ○ | | |
| BPhen | ○ | × | | ○ | ○ | |
| CBP | ○ | △ | | △ | × | |
| PyPySPyPy | ○ | ○ | ○ | ○ | × | |
| tBu-PBD | ○ | ○ | ○ | ○ | ○ | |
| TPD | ○ | ○ | ○ | ○ | × | ○ |
| α-NPD | × | × | ○ | × | | |
| TAPC | ○ | | ○ | | | |
| PVCz | ○ | ○ | ○ | ○ | | |
| C6 | ○ | ○ | ○ | ○ | | ○ |
| Ir(ppy)3 | △ | △ | | △ | × | |
| FIrpic | ○ | | ○ | | | |
| (btp)₂Ir(acac) | ○ | | ○ | | | |
| Ir(tpy)3 | ○ | ○ | ○ | | | |
| DCJTB | ○ | | ○ | | | |
| PMMA | ○ | ○ | × | | | |
| Cyclolefin | △ | × | ○ | | | |
| PVP | | ○ | | | | |
| Cyanoresin | | △ | | | | |
| PPR | ○ | ○ | ○ | | | |
| MEH-PPV | ○ | ○ | ○ | | | |
| P3HT | ○ | ○ | ○ | | | |
| H-2 | ○ | ○ | ○ | | | |
| BPPC | ○ | ○ | △ | | | |
| td-PTC | × | × | × | | | |
| CuPc | × | × | × | | | |
| PTCDA | × | × | × | | | |
| BTBP | ○(0.2wt%) | | × | | | |
| Fluorescein | × | ○ | × | | | |
| Perylene | ○(0.2wt%) | ○ | ○(0.4wt%) | | | |

○: soluble    △: soluble at high temperature    ×: insoluble

OPTICAL RECEIVING

OPTICAL RECEIVING

OPTICAL RECEIVING

ORGANIC PHOTODIODE AND METHOD FOR MANUFACTURING THE ORGANIC PHOTODIODE

BACKGROUND OF THE INVENTION

The present invention relates to an organic photodiode having a plurality of light receiving elements containing light absorbing composition such as organic material, and a method for manufacturing the same.

DESCRIPTION OF THE RELATED ART

Hitherto, a photodiode for converting light energy into current or voltage and capturing changes in light intensity is manufactured by disposing a transparent electrode on an insulating substrate, disposing a photosensitive layer as a layer of light absorbing composition and an insulating film for insulating between electrodes on this transparent electrode, and further disposing a metal electrode thereon. For example, Japanese Patent Laid-Open Publication No. HEI 5-335541 discloses an organic image sensor which can be manufactured easily and inexpensively by composing a light absorbing composition with organic material.

Manufacturing technology of such photodiode is generally realized by photolithography of cutting out oxide film or aluminum film by using photo engraving technology. For example, in the case of oxide film etching by photolithography, an oxide film is formed on the substrate, and photo resist is applied and dried (baked). The photo mask and the substrate are correctly adjusted in position, and exposure and development are applied, and unnecessary resist is removed. The oxide film in the portion free of resist is dissolved and removed by using an oxide film dissolving solution, and finally the remaining resist is removed. As a result, an undulation pattern is formed, and a light absorbing composition is poured, and a photosensitive layer is formed on the substrate.

On the other hand, in this technology of photolithography, positioning of photo mask is difficult, and when manufacturing a panel of high definition, forming of photo mask is technically difficult, and if manufactured, correct patterning is more difficult.

Recently, in the field of organic EL element having a similar configuration to organic photodiode, patterning technique using ink jet is attracting attention. FIG. 19 is a diagram explaining a conventional manufacturing method of organic EL element. That is, as shown in FIG. 19, according to the following processes (1) to (6), a multicolor EL display device is manufactured. (1) An anode 111a is provided on a substrate 110. (2) The anode 111a is patterned in a specified pattern. (3) An insulating layer 111b is formed. (4) The insulating layer 111b at a position corresponding to the anode 111a is removed by photolithography, and the remaining insulating layer 111b is used as partition wall 111b2. (5) In each section divided by the partition wall 111b2, organic EL material of specified color 111c is disposed by ink jet method. (6) Cathodes 111d are formed. In FIG. 19, the cathodes 111d are disposed parallel within a plane parallel to the anodes 111a so as to extend in a direction orthogonal to the anodes 111a. Thus, by using the ink jet technology, accurate and inexpensive patterning of EL material is realized. These techniques are disclosed, for example, in Japanese Patent Laid-Open Publication No. HEI 10-12377 and Japanese Patent Laid-Open Publication No. HEI 11-87063.

The patterning technique using the above-mentioned ink jet is applied in organic EL and other display device, and it has been attempted to apply this technique in manufacture of organic photodiode. That is, the light absorbing composition composed of organic material is patterned on a substrate by ink jet method, and an organic photodiode is manufactured.

SUMMARY OF THE INVENTION

In the patterning technique using ink jet, however, the organic material injected from the ink jet is not always formed on correct pattern position, and the actually formed pattern is often deviated in position. Such deviation of pattern position of organic material may lead to various problems such as short-circuiting or defects of organic photodiode. Even by the patterning technique using ink jet, the processes of lithography for forming partition wall (bank) and patterning are needed, and shortening of process and reduction of cost by this technique are limited.

Further, the organic EL and other display devices are light emitting devices, while the organic photodiodes (light receiving elements) are light receiving devices, and the both are different in application and configuration, and the materials used for manufacturing the devices are also different. Indeed, application of the above-mentioned ink jet patterning technique in manufacture of organic photodiode is difficult, and in particular it is necessary to solve various problems, such as reduction of characteristic dark current of light receiving element and improvement of dielectric strength.

The invention is devised to solve these problems, and it is hence an object thereof to present an organic photodiode of high quality having the light absorbing composition made of organic material formed accurately. It is another object to present a manufacturing method of organic photodiode capable of manufacturing in a simple process, and reducing the manufacturing cost.

To achieve the objects, it is a first aspect of the present invention to present an organic photodiode comprising a pair of electrodes that is disposed oppositely to each other, a substrate that forms one electrode of the pair of electrodes, a plurality of light receiving parts as layers of light absorbing composition that is disposed in a gap of the pair of electrodes, and partition walls that is formed in a gap of the pair of electrodes for insulating between the pair of electrodes and insulating between the light receiving part and other light receiving part, in which the partition walls are formed at a position corresponding to the one electrode on an insulating layer covering the one electrode and its surrounding, by applying an ink solution containing a solvent for dissolving the insulating layer and the light absorbing composition, evaporating the solvent in the ink solution after dissolving the insulating layer, and forming a plurality of dissolved holes as spaces contacting with this one electrode, and the plurality of light receiving parts are formed by filling the plurality of dissolved holes with the light absorbing composition in the ink solution.

In this organic photodiode, between the pair of electrodes disposed oppositely to each other, a plurality of light receiving parts and partition walls are provided, and the partition walls are a plurality of dissolved holes formed by dissolving the insulating layer by application of the above-mentioned ink solution, and the plurality of light receiving parts are formed by filling the plurality of dissolved holes with the light absorbing composition. As a result, the light absorbing composition made of organic material is formed accurately, and an organic photodiode of high quality realizing reduction of dark current and high sensing performance is presented.

In the organic photodiode, preferably, the substrate is made of a transparent material, and one electrode of the pair of electrodes is a transparent electrode, and other electrode of the pair of electrodes is a non-transparent reflection electrode.

As a result, the organic photodiode receives light from the substrate direction, and executes optical sensing.

In the organic photodiode, preferably, one electrode of the pair of electrodes is a non-transparent reflection electrode, and other electrode of the pair of electrodes is a transparent electrode.

As a result, the organic photodiode receives light from the opposite direction of the substrate, and executes optical sensing.

In the organic photodiode, preferably, the substrate is made of a transparent material, and one electrode of the pair of electrodes is a transparent electrode, and other electrode of the pair of electrodes is a transparent electrode.

As a result, the organic photodiode receives light from both sides of the light receiving parts, and executes optical sensing.

In the organic photodiode, preferably, the light absorbing composition is a mixture of two or more organic materials.

As a result, since the light absorbing composition is a mixture of two or more organic materials, the organic photodiode can use hole transport material and electron transport material as light absorbing composition, and exhibits a higher sensing performance.

In the organic photodiode, preferably, between the anode of the pair of electrodes and the light receiving parts, a hole transport layer is formed by using a material having an insoluble property in the solvent of the ink solution and having at least hole transport property.

As a result, since the hole transport layer is formed between the anode and the light receiving parts, the organic photodiode exhibits a higher sensing performance.

In the organic photodiode, preferably, between the cathode of the pair of electrodes and the light receiving parts, an electron transport layer is formed by using a material having an insoluble property in the solvent of the ink solution and having at least electron transport property.

As a result, since the electron transport layer is formed between the cathode and the light receiving parts, the organic photodiode exhibits a higher sensing performance.

In the organic photodiode, preferably, the light absorbing composition contains perylene derivative or pyrazoline derivative.

As a result, the organic photodiode achieves high photo current and photoconductive ratio.

In the organic photodiode, preferably, the perylene derivative is N,N'-ditridecyl-3,4,9,10-perylene-tetracarboxylic-diimide.

As a result, the organic photodiode achieves high photo current and photoconductive ratio.

In the organic photodiode, preferably, the perylene derivative is N,N'-bis(2,5-di-tert-butyl phenyl)-3,4,9,10-perylene dicarboximide.

As a result, the organic photodiode achieves high photo current and photoconductive ratio.

In the organic photodiode, preferably, the pyrazoline derivative is 4-[2-[5-[4-(diethylamino) phenyl]-4,5-dihydro-1-phenyl-1H-pyrazole-3-yl]-ethenyl]-N,N-diethyl aniline.

As a result, the organic photodiode achieves high photo current and photoconductive ratio.

In the organic photodiode, preferably, the insulating layer is composed of cyclo-olefin polymer.

As a result, the partition walls of the organic photodiode exhibit an excellent insulating property.

It is a second aspect of the present invention to present a manufacturing method of organic photodiode, being a method for manufacturing an organic photodiode comprising a pair of electrodes disposed oppositely to each other, a substrate forming one electrode of the pair of electrodes, a plurality of light receiving parts as layers of light absorbing composition disposed in a gap of the pair of electrodes, and partition walls formed in a gap of the pair of electrodes for insulating between the pair of electrodes and insulating between the light receiving part and other light receiving part, comprising a first electrode forming process that forms the one electrode on the substrate, an insulating layer forming process that forms an insulating layer covering the one electrode and its surrounding, an ink solution applying process that applies an ink solution containing a solvent for dissolving the insulating layer and the light absorbing composition on the insulating layer at a position corresponding to the one electrode, a light receiving part forming process that forms the plurality of light receiving parts by evaporating the solvent in the ink solution after dissolving the insulating layer, forming a plurality of dissolved holes as spaces contacting with the one electrode, and filling the plurality of dissolved holes with the light absorbing composition of the ink solution, and a second electrode forming process that forms other electrode of the pair of electrodes on the plurality of light receiving parts.

As a result, the manufacturing method of organic photodiode can shorten the manufacturing process of organic photodiode, and reduce the manufacturing cost.

In the manufacturing method of organic photodiode, preferably, the substrate is made of a transparent material, and one electrode of the pair of electrodes is a transparent electrode, and other electrode of the pair of electrodes is a non-transparent reflection electrode.

As a result, the manufacturing method of organic photodiode can manufacture an organic photodiode which receives light from the substrate direction, and executes optical sensing.

In the manufacturing method of organic photodiode, preferably, one electrode of the pair of electrodes is a non-transparent reflection electrode, and other electrode of the pair of electrodes is a transparent electrode.

As a result, the manufacturing method of organic photodiode can manufacture an organic photodiode which receives light from the opposite direction of the substrate, and executes optical sensing.

In the manufacturing method of organic photodiode, preferably, the substrate is made of a transparent material, and one electrode of the pair of electrodes is a transparent electrode, and other electrode of the pair of electrodes is a transparent electrode.

As a result, the manufacturing method of organic photodiode can manufacture an organic photodiode which receives light from both sides of the light receiving parts, and executes optical sensing.

In the manufacturing method of organic photodiode, preferably, the light absorbing composition is a mixture of two or more organic materials.

As a result, in the manufacturing method of organic photodiode can manufacture the organic photodiode that exhibits a higher sensing performance, since the light absorbing composition is a mixture of two or more organic materials, the organic photodiode can use hole transport material and electron transport material as light absorbing composition.

In the manufacturing method of organic photodiode, preferably, the method further comprises a first transport layer forming process of forming a hole transport layer by using a material having an insoluble property in the solvent of the ink solution and having at least hole transport property, or an electron transport layer by using a material having an insoluble property in the solvent of the ink solution and having at least electron transport property, on the one electrode formed on the substrate in the first electrode forming process.

As a result, since the manufacturing method of organic photodiode further comprises the first transport layer forming process of forming the hole transport layer or electron transport layer on one electrode, an organic photodiode capable of exhibiting a higher sensing performance can be manufactured.

In the manufacturing method of organic photodiode, preferably, the method further comprises a second transport layer forming process of forming a hole transport layer by using a material having an insoluble property in the solvent of the ink solution and having at least hole transport property, or an electron transport layer by using a material having an insoluble property in the solvent of the ink solution and having at least electron transport property, on the plurality of light receiving parts formed in the light receiving part forming process.

As a result, since the manufacturing method of organic photodiode further comprises the second transport layer forming process of forming the hole transport layer or electron transport layer on a plurality of light receiving parts, an organic photodiode capable of exhibiting a higher sensing performance can be manufactured.

In the manufacturing method of organic photodiode, preferably, the light absorbing composition contains perylene derivative or pyrazoline derivative.

As a result, the manufacturing method of organic photodiode can manufacture an organic photodiode capable of achieving high photo current and photoconductive ratio.

In the manufacturing method of organic photodiode, preferably, the perylene derivative is N,N'-ditridecyl-3,4,9,10-perylene tetracarboxylic-diimide.

As a result, the manufacturing method of organic photodiode can manufacture an organic photodiode capable of achieving high photo current and photoconductive ratio.

In the manufacturing method of organic photodiode, preferably, the perylene derivative is N,N'-bis (2,5-di-tert-butyl phenyl)-3,4,9,10-perylene dicarboximide.

As a result, the manufacturing method of organic photodiode can manufacture an organic photodiode capable of achieving high photo current and photoconductive ratio.

In the manufacturing method of organic photodiode, preferably, the pyrazoline derivative is 4-[2-[5-[4-(diethylamino)phenyl]-4,5-dihydro-1-phenyl-1H-pyrazole-3-yl]-ethenyl]-N,N-diethyl aniline.

As a result, the manufacturing method of organic photodiode can manufacture an organic photodiode capable of achieving high photo current and photoconductive ratio.

In the manufacturing method of organic photodiode, preferably, the insulating layer is composed of cyclo-olefin polymer.

As a result, the manufacturing method of organic photodiode can manufacture an organic photodiode having partition walls exhibiting an excellent insulating property.

BRIEF DESCRIPTION OF THE DRAWINGS

FIGS. 2A, 2B are tables showing presence or absence of photoconductivity of materials used in organic EL and organic photosensitive materials.

FIG. 3 is a table showing test results of solubility of organic materials in solution.

DETAILED DESCRIPTION OF EMBODIMENTS

A first embodiment of organic photodiode and its manufacturing method of the present invention is described specifically below while referring to accompanying drawings. An organic photodiode 1 of the embodiment is a Schottky type organic photodiode having a pair of electrodes consisting of a transparent anode on one side and a non-transparent reflection cathode on the other side.

Figure 1:
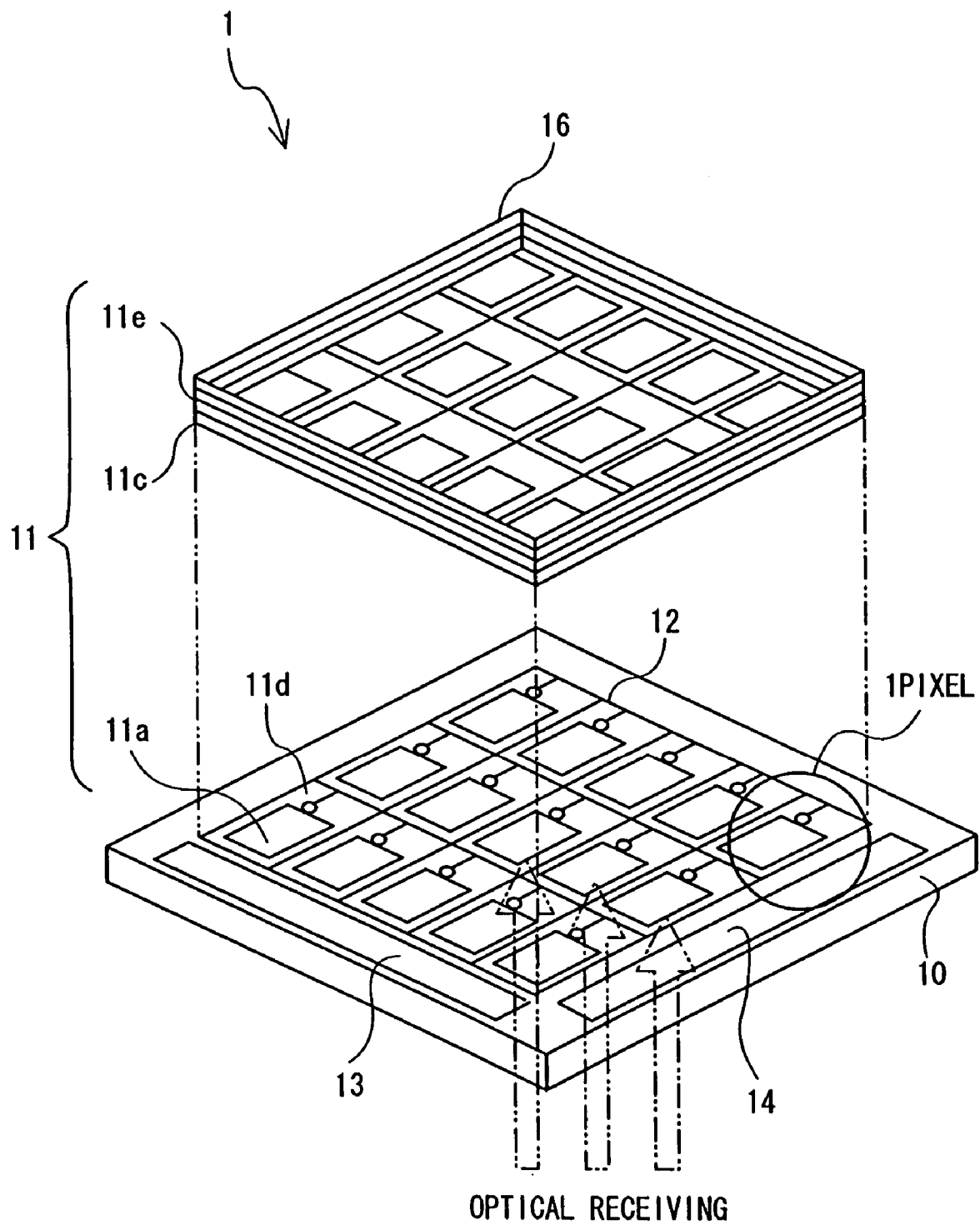
FIG. 1 is a three-dimensional construction drawing showing physical configuration of organic photodiode 1.

Configuration of organic photodiode 1 is explained. FIG. 1 is a three-dimensional construction drawing showing a physical configuration of organic photodiode 1.

As shown in FIG. 1, the organic photodiode 1 comprises a glass substrate 10, and a light receiving element 11, a switching TFT 12, a horizontal address circuit 13, a vertical address circuit 14 and a sealing layer 16 disposed on the glass substrate 10. The light receiving element 11 is formed in the center of the glass substrate 10, and 15 pixels are formed in grid pattern. Each pixel includes a light receiving part 11c, and a transparent anode 11a and a reflection cathode 11e enclosing the light receiving part 11c from above and beneath. The light receiving part 11c is a photoelectric converting layer formed of light absorbing composition composed of an organic material. The glass substrate 10 corresponds to the substrate of the present invention.

One switching TFT 12 is formed in each pixel of the light receiving element 11, and the horizontal address circuit 13 and the vertical address circuit 14 control application of voltage to the switching TFT 12 corresponding to each pixel. In the gap of the transparent anode 11a and the reflection cathode 11e, a partition wall 11d is formed as an insulating layer for insulating between adjacent pixels. The sealing layer 16 covers from above and protects the light receiving element 11, switching TFT 12, horizontal address circuit 13, and vertical address circuit 14.

In the organic photodiode 1 having such configuration, the most important problem is reduction of dark current. In the case of an organic EL element, dependence of resistivity of insulating film (partition wall 11d) on element characteristics is relatively low, if the resistance value of the insulating film deteriorates, and effects of dark current are received from an adjacent element, since the element does not emit light unless the voltage reaches a specific value, if dark current occurs, illumination characteristics of the entire panel are not so much influenced. On the other hand, in an organic photodiode, if dark current equal to or higher than that in the case of reverse biasing flows in the insulating film (partition wall 11d), the dark current is multiplied among electrodes disposed in grid pattern, and the S/N ratio is lowered substantially, and a serious adverse effect is given to the precision of optical sensing.

Accordingly, in the organic photodiode 1, reduction of dark current is essential, and photoconductivity is also needed. The partition wall 11d is required to have a property not accompanied by generation or rebonding of carrier, and necessary conditions are to be, for example, excellent in morphology after forming, less likely to crystallize (to be amorphous), and stable in bonding within a molecule.

In the embodiment, as mentioned below, an ink solution containing light absorbing composition and organic solvent is applied on the insulating layer by ink jet, and a partition wall 11d is formed, and therefore the ink solution is required to have a viscosity suited to ink jet. Further, the partition wall 11d formed by ink jet is required to be uniform in film thickness. If the film thickness of the partition wall 11d is not uniform, leak current at low voltage side may increase in a thin portion of film thickness.

Operation mechanism of organic photodiode 1 is explained. In individual pixels of light receiving element 11, if light larger than energy difference of highest occupied molecular orbit (HOMO) and lowest unoccupied molecular orbit (LUMO) of organic material (light absorbing composition) for composing the light receiving part 11c is irradiated by transmitting through the glass substrate 10, a pair of electron and hole is generated. In terms of semiconductor, by irradiation of light energy of larger than forbidden band width, a pair or electron and hole is generated in the organic material (light absorbing composition). When a reverse bias is applied between the transparent anode 11a and the reflection cathode 11e, this pair of electron and hole is attracted by electric field and separated and moved, so that an electric current flows in the light receiving element 11. The current flowing in the light receiving element 11 is proportional to the quantity of light transmitting through the glass substrate 10.

To realize such operation mechanism effectively, the organic photodiode 1 is required to have the following conditions. (1) Sufficient carriers must be formed by light irradiation. That is, in the light receiving part 11c, sufficiently effective light absorption is needed together with excitation of effective carrier for HOMO, LUMO levels. (2). The excited carrier should be transported to the electrodes 11a, 11e at sufficiently high speed by the electric field. For this purpose, the mobility should be high in the layer of transporting the electron and hole, and more preferably conduction should be non-dispersing. (3) The carrier generated in the light receiving part 11c should reach up to the electrodes 11a, 11e effectively, by transmitting through the interface of the organic film (light receiving part 11c) and the electrodes 11a, 11e. It is hence required that there should be no barrier for move of carrier at the interface of organic film and electrodes.

When mounting as an actual device, (4) the dielectric strength should be high in application of reverse bias, and leak current should not flow. That is, in the organic photodiode 1, unlike the organic solar cell, since the bias is applied from outside, dielectric strength to withstand the bias and reduction of leak current are necessary. Accordingly, the organic photodiode 1 is preferred to have a structure not causing local concentration of electric field, the flatness of glass substrate 10 and the electrodes 11a, 11e is excellent, the organic film (light receiving part 11c) is formed uniformly and flatly and should not be crystallized, and the organic film (light receiving part 11c) is made of material of large breakdown electric field strength, etc.

The organic photodiode 1 of the embodiment is composed to satisfy the above conditions (1) to (4), and the detail is described below.

The light absorbing composition forming the light receiving part 11c preferably contains photoconductive substance increasing in conductivity when exposed to light, and has characteristics of high photo current and photoconductive ratio, and hence perylene derivative or pyrazoline derivative is used. Among the materials used in organic EL element or organic photosensitive element, presence or absence of photoconductivity is compiled in FIGS. 2A, 2B. As a result, regardless of quality of photoconductivity, photoconductivity is confirmed in the following materials: N,N'-bis (2,5-di-tert-butylphenyl)-3,4,9,10-perylene dicarboximide (BPPC), Fullerene (C60), copper phthalocyanine (CuPc), copper (II) 1, 2, 3, 4, 8, 9, 10, 11, 15, 16, 17, 18, 22, 23, 24, 25-hexadecafluoro-29H,31H-phthalocyanine (F16 CuPc), 2-methoxy, 5-(2'-ethyl-hexyloxy)-1,4-phenylene vinylene (MEH-PPV), 4-[2-[5-[4-(Diethylamino)phenyl]-4,5-dihydro-1-phenyl-1H-pyrazol-3-yl]-ethenyl]-N,N-diethylaniline (PPR), perylene tetracarboxylic derivative (PTCBI), 2,5-bis (6'-(2'-2"-bipyridyl))-1,1-dimethyl-3,4-diphenylsilole (Py-PySpPy), pyrazoline derivative (PYR-Dl), 5,6,11,12-tetraphenyl naphthacene (rubrene), ditridecyl perylene tetracarboxylic diimide (td-PTC), and 5,10,15,20-tetraphenyl-21H,23H-porhine (TPP), etc. The light absorbing composition having particularly high photo current and photoconductive ratio, such as copper phthalocyanine (CuPc), N,N'-ditridecyl-3,4,9,10-perylene-tetracarboxylic diimide (td-PTC), N,N'-bis-(2,5-di-tert-butylphenyl)-3,4,9,10-perylene dicarboximide (BPPC), and 4-[2-[5-[4-(diethylamino)phenyl]-4,5-dihydro-1-phenyl-1H-pyrazol-3-yl]-ethenyl]-N,N-diethylaniline (P-1), is preferred. Accordingly, in the light receiving part 11c, since sufficient carriers are formed when exposed to light, the condition (1) is satisfied. The light absorbing composition of the present invention includes the concept of, as mentioned below, hole transport material or electron transport material, etc. for forming a layer exhibiting light receiving function together with the light receiving part 11c.

The transparent anode 11a is a transparent electrode made of indium tin oxide (ITO) capable of assuring high work function and transparency, and the reflection cathode 11e is made of Al, which is a non-transparent material capable of reflecting light. The organic photodiode 1 of the embodiment is a Schottky type organic photodiode of single layer structure, in principle. In the organic photodiode, the main purpose is electron transport from organic layer to cathode, and unlike the organic EL element, it is not necessary to form an insulating layer at the interface of organic layer and cathode, or use tunnel injection promoting layer, and therefore in the Schottky type diode structure capable of reacting more quickly to light, electron transport from the light receiving part 11c to the reflection cathode 11e is realized. As a result, the carrier is transported toward the electrodes 11a, 11e at a sufficiently high speed, and reaches the electrodes 11a, 11e more effectively, so that the conditions (2) and (3) are satisfied.

The insulating material for forming the partition wall 11d is preferably a material achieving a higher insulation performance, and having a property of dissolving in organic solvent. That is, the organic photodiode 1 of the embodiment is manufactured, as described blow, in a manufacturing method characterized by applying an ink solution containing light absorbing composition and organic solvent to an insulating layer by ink jet, dissolving the insulating layer by the organic solvent to form a plurality of dissolved holes, and filling the dissolved holes with the light absorbing composition in self-matching manner, and therefore the insulating material is required to have a property of dissolving in the organic solvent. In this embodiment, cyclo-olefin polymer is preferred as insulating material from the viewpoints of insulating performance and dissolving performance, and chloroform solution is used as organic solvent. As a result, the partition wall lid suppresses local concentration of electric field in the organic photodiode 1, and the condition (4) is satisfied.

The viscosity of ink solution is $1\times10^{-3}$ to $1\times10$ Pa-s, more preferably, $5\times10^{-3}$ to $1.5\times10^{-2}$ Pa-s, so that the drop diameter can be controlled when discharging ink solution by ink jet method. The surface tension of ink solution is preferred to be in a range of 20 to 50 mN/m, so that flight bending can be suppressed when discharging ink solution by ink jet method.

Thus, the organic photodiode 1 of the embodiment is composed to satisfy the conditions (1) to (4) by the self-matching manufacturing method of organic photodiode described below. By the ink solution having a proper viscosity suited to ink jet, partition walls 11d of uniform film thickness are formed, and in addition since the partition walls 11d have characteristic not accompanied by generation or rebonding of carrier, dark current is decreased. The organic photodiode 1 has both properties of decrease of dark current and high photoconductivity.

In addition to the discussion from the viewpoint of device operation mechanism, the following conditions are also required from the viewpoint of device manufacture. (5) Wetting to the substrate material should be excellent, and the organic thin film should be formed uniformly, (6) viscosity of solution should be applicable to ink jet printing, and (7) organic material should be soluble in solution, etc. As for condition (5), it is known that favorable ink printing and forming of organic film are realized by careful washing of substrate and UV ozone cleaner treatment after washing. As for condition (6), by optimizing the pulse width, pulse slope and voltage applied to piezo element at the time of ink jet, ink jet applicable condition is discovered in a viscosity range of less than 1 cp to about 10 cp. Results of discussion of condition (7) are shown in FIG. 3. As material for insulating partition wall, in particular, methyl polymethacrylate, polycarbonate, and cyclo-olefin are studied. Leak current is observed in methyl polymethacrylate, but it may be partly used in confirmation of photoconductive operation of organic photodiode. In polycarbonate, when 1,2-dichloroethane is used as solvent, it is hard to obtain conduction as device. In the case of cyclo-olefin, insulating performance is favorable at about $10^{-6}$ to $10^{-5}$ A/cm$^2$, and a device can be formed. For example, when an ink of polyvinyl carbazole+ color former is printed on an insulating film of methyl polymethacrylate by ink jet, it is confirmed that a phase separation structure in the order of several hundred nanometers is formed. In this material system, incidentally, the polyvinyl carbazole portion is flat, and the methyl polymethacrylate portion becomes convex, and hence a device may be formed. However, considering other problem such as concentration of electric field, the organic photodiode portion must be formed flatly. Accordingly, by using an organic photodiode material of low molecular material, and printing in high molecular insulating film by ink jet, formation of organic photodiode is studied. As a result, the organic photodiode portion is formed flatly in the organic film, and it is considered effective for manufacture of device. The characteristics of organic photodiode are particularly favorable by using 4-[2-[5-[4-(diethylamino)phenyl]-4,5-dihydro-1-phenyl-1H-pyrazol-3-yl]-ethenyl]-N,N-diethylaniline (PPR) or ditridecyl perylene tetracarboxylic diimide (td-PTC), among the photoconductive materials listed above. When used as solution system, the former is dissolved in various solutions, while the latter is not dissolved at all. Hence, 4-[2-[5-[4-(diethylamino) phenyl[-4,5-dihydro-1-phenyl-1H-pyrazol-3-yl]-ethenyl]-N,N-diethylaniline (PPR) is considered to be suited as material for solution system organic photodiode.

Figure 4:
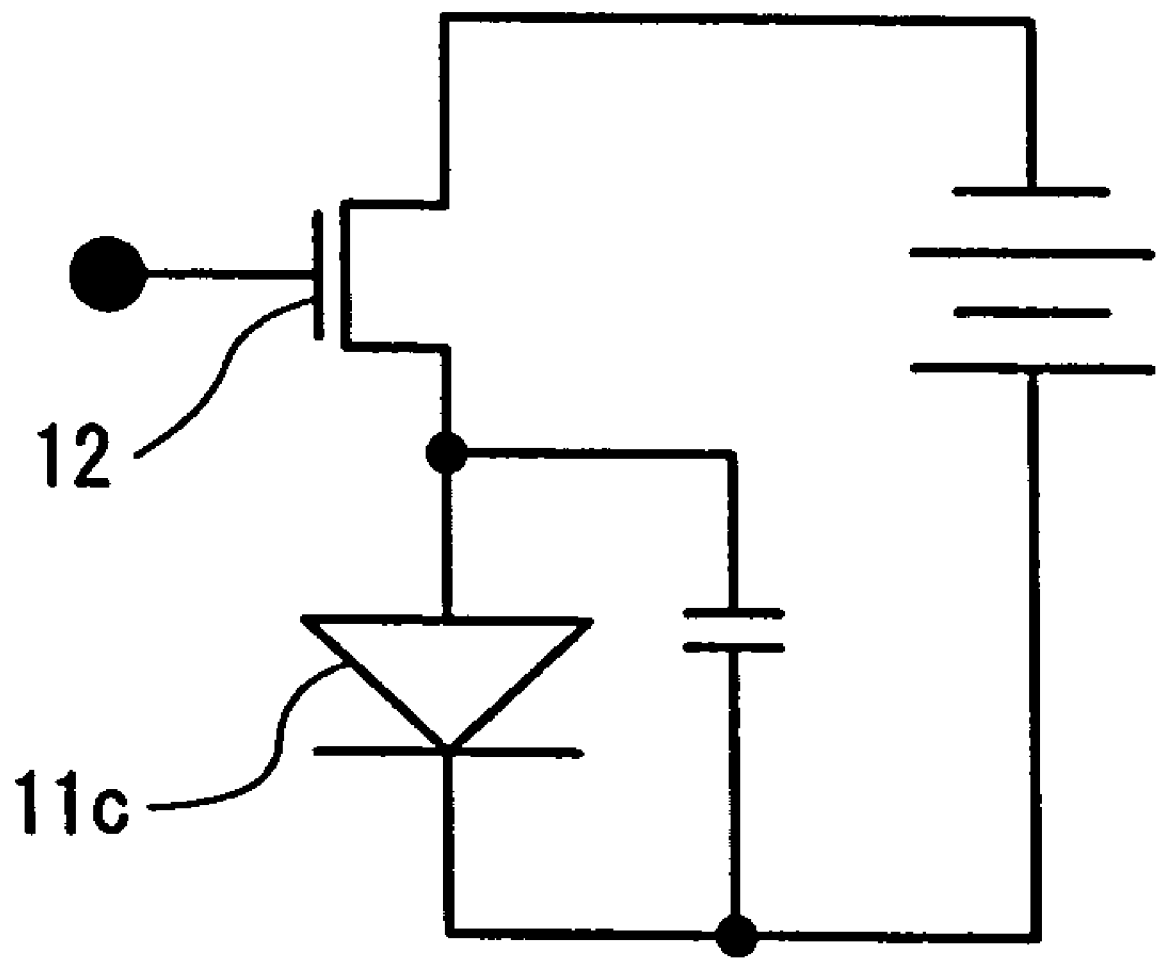
FIG. 4 is a circuit diagram of one pixel of organic photodiode 1.
Figure 5:
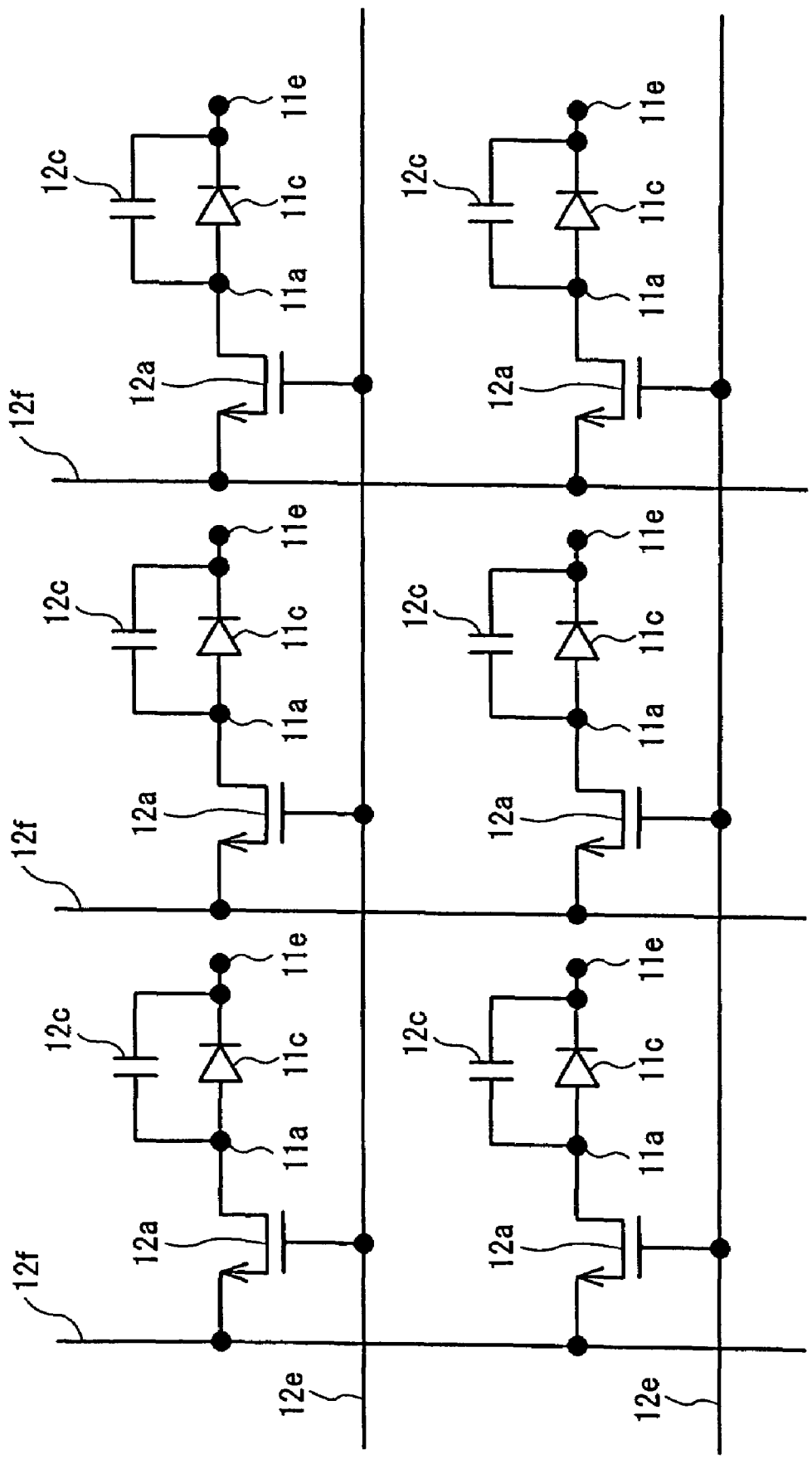
FIG. 5 is a circuit diagram of entire circuit of organic photodiode 1.

The switching TFT 12 is explained. FIG. 4 is a circuit diagram of one pixel of organic photodiode 1. FIG. 5 is a circuit diagram of entire circuit of organic photodiode 1.

The organic photodiode 1 has a switching TFT 12 provided in each pixel of the light receiving element 11 as shown in FIG. 1. This switching TFT 12 functions, as shown in FIG. 4, as a switch for controlling voltage application to individual pixels (light receiving parts 11c) of the light receiving element 11.

The configuration of the switching TFT 12 is explained by referring to the equivalent circuit in FIG. 5. FIG. 5 is a repetition diagram about six pixels. The switching TFT 12a includes, as shown in FIG. 5, data line 12f connected to vertical address circuit 14, scanning line 12e connected to horizontal address circuit 13, capacitor 12c for holding the bias signal supplied from data line 12f, and switching TFT 12a for reading out the bias signal held in the capacitor 12c. Using the transparent anode 11a as anode and the reflection cathode 11e as cathode, bias current flows between the anode and the cathode depending on the voltage applied by the switching TFT 12.

On the other hand, when light is emitted to the light receiving part 11c, an electric charge is generated by photoelectric conversion. In this embodiment, the electric charge generated in the light receiving part 11c is taken out by the reflection cathode 11e as cathode as a signal representing the quantity of light received. The reflection cathode 11e is connected to a signal processing circuit (not shown) by way of data line 12f, and a feeble signal issued from the reflection cathode 11e is amplified, and processed depending on each device.

Figure 6:
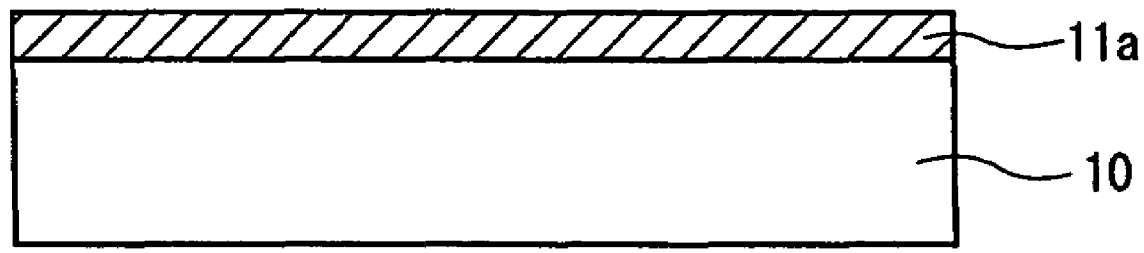
FIG. 6 is a partial sectional view of organic photodiode 1 for explaining first electrode forming process.
Figure 7:
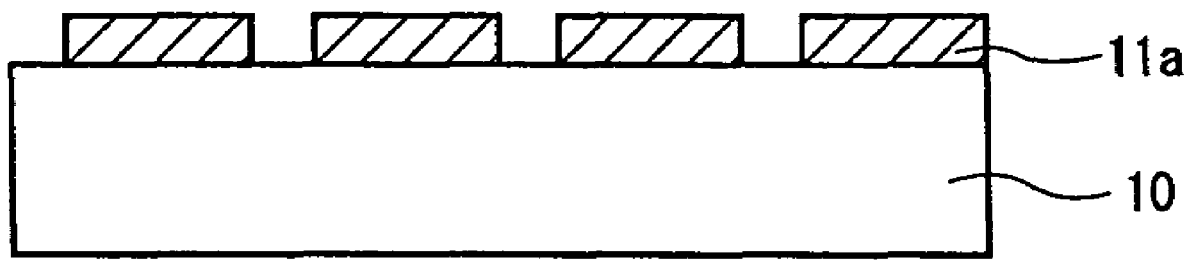
FIG. 7 is a partial sectional view of organic photodiode 1 for explaining first electrode forming process.
Figure 8:
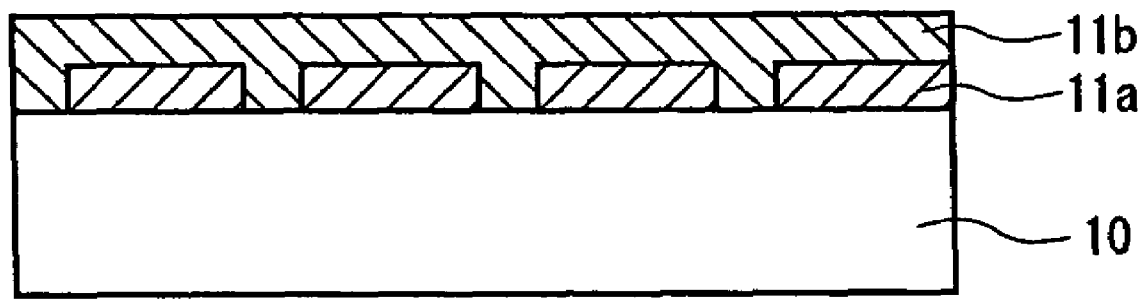
FIG. 8 is a partial sectional view of organic photodiode 1 for explaining insulating layer forming process.
Figure 9:
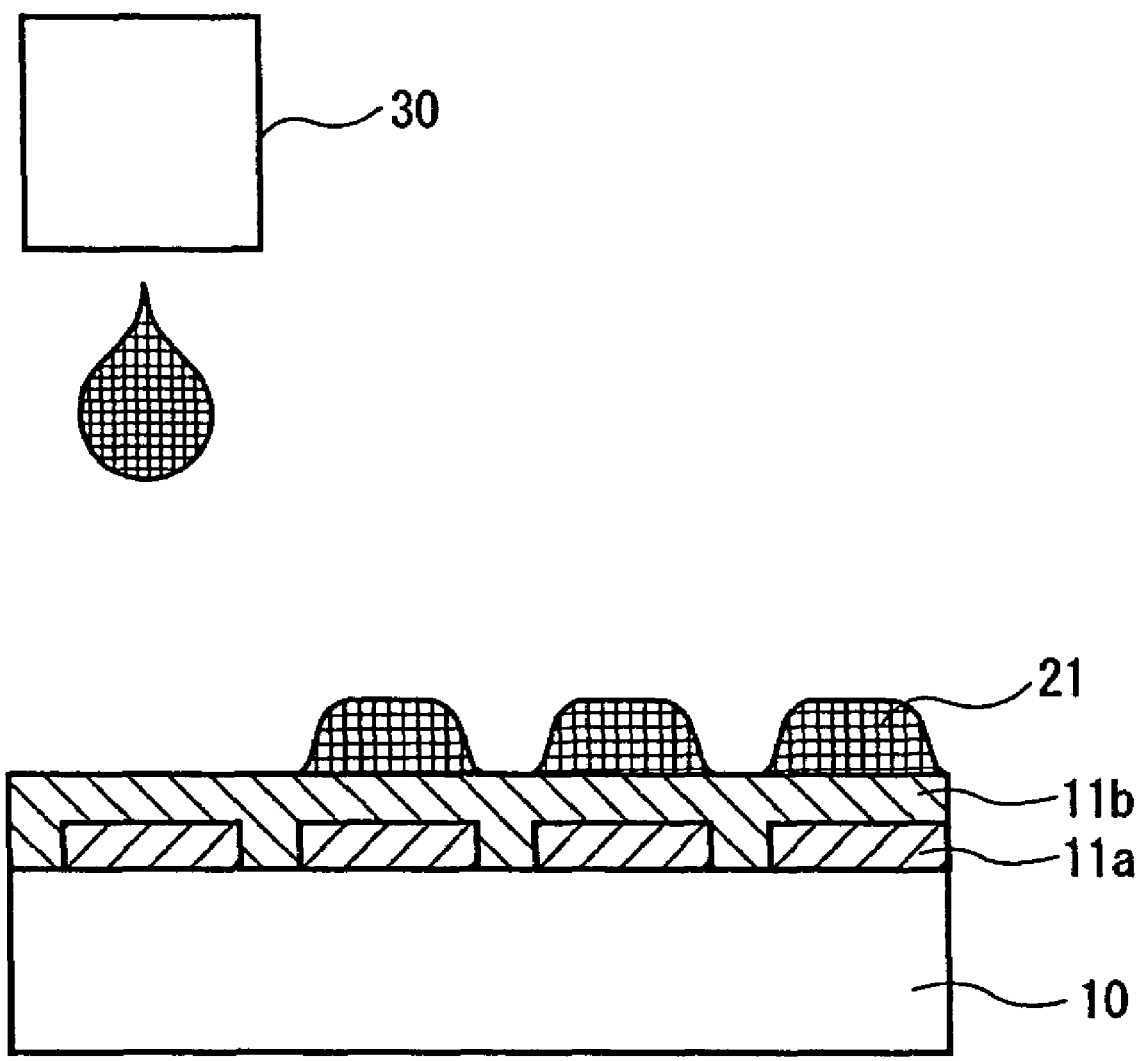
FIG. 9 is a partial sectional view of organic photodiode 1 for explaining ink solution applying process.
Figure 10:
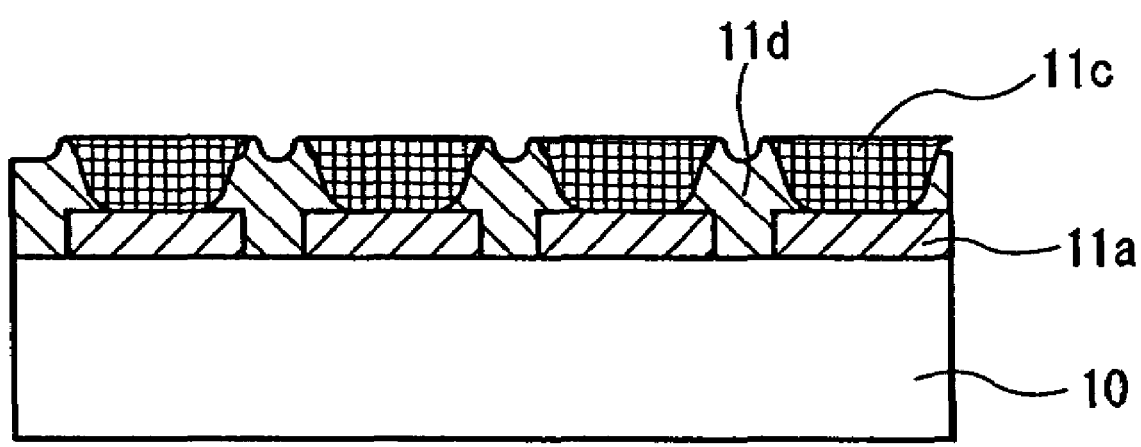
FIG. 10 is a partial sectional view of organic photodiode 1 for explaining light receiving part forming process.
Figure 11:
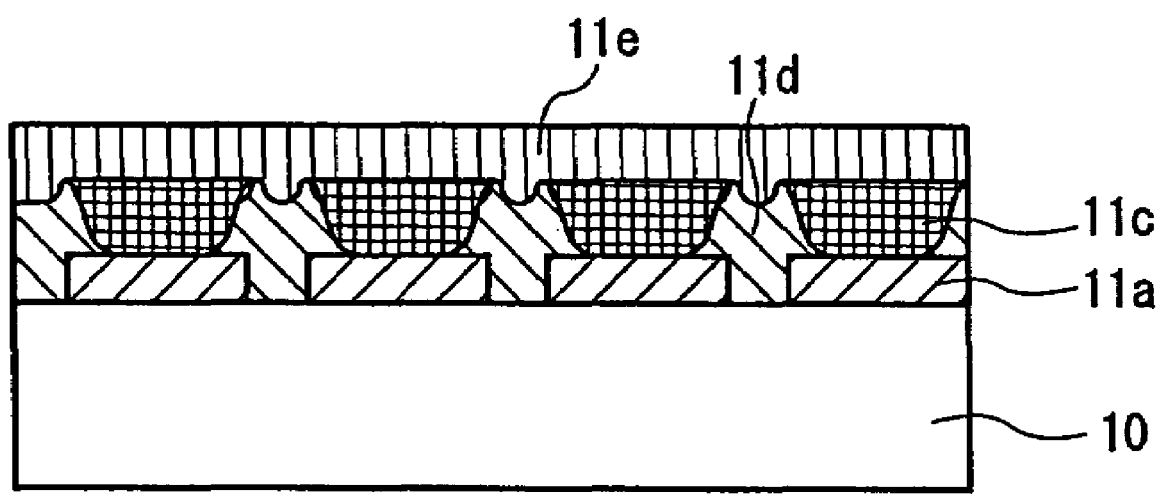
FIG. 11 is a partial sectional view of organic photodiode 1 for explaining second electrode forming process.
Figure 12:
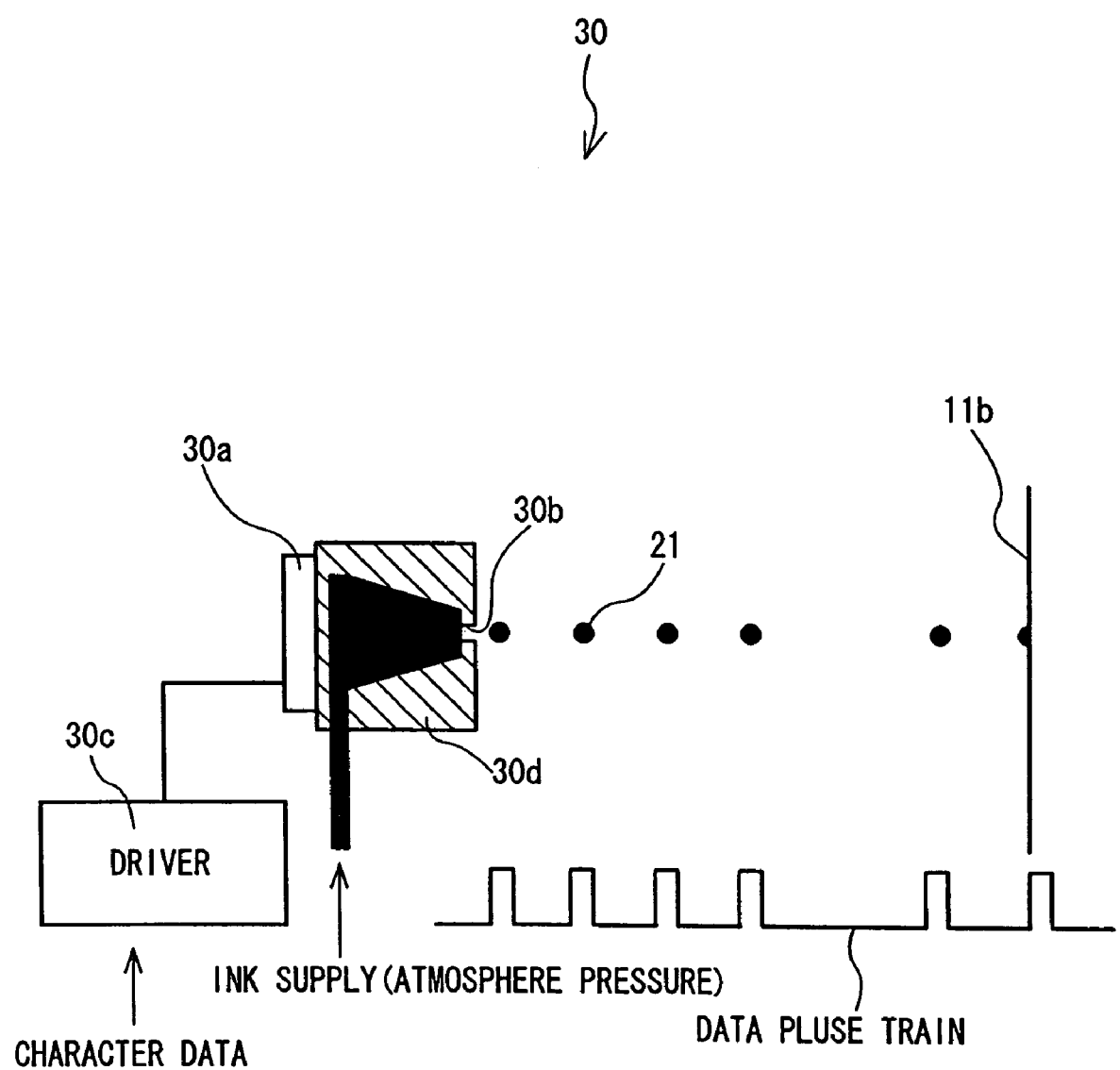
FIG. 12 is an explanatory diagram of structure of ink jet head 30.

An embodiment of manufacturing method of organic photodiode 1 is explained. FIG. 6 and FIG. 7 are partial sectional views of organic photodiode 1 for explaining first electrode forming process. FIG. 8 is a partial sectional view of organic photodiode 1 for explaining insulating layer forming process. FIG. 9 is a partial sectional view of organic photodiode 1 for explaining ink solution applying process. FIG. 10 is a partial sectional view of organic photodiode 1 for explaining light receiving part forming process. FIG. 11 is a partial sectional view of organic photodiode 1 for explaining second electrode forming process. FIG. 12 is an explanatory diagram of structure of ink jet head 30. FIG. 6 to FIG. 12 show only the portion of light receiving element 11 of the organic photodiode 1, and in particular explain the manufacturing method of the light receiving element 11 which is an essential part.

First, in the first electrode forming process shown in FIG. 6 and FIG. 7, ITO is evaporated on a glass substrate 10 in a thickness of 150 nm by magnetron sputtering method, and a transparent anode 11a is formed (see FIG. 6). The surface resistance of this transparent anode 11a is 500 to 600 uohm/cm, and light transmissivity is 81%. An exposure resist is applied on the transparent anode 11a by spin coating, and a desired electrode pattern is exposed by using mask. By etching using aqua regia composed of concentrated nitric acid and concentrated hydrochloric acid, the resist in the non-exposed portion and the transparent anode 11a are removed, and a desired electrode pattern is formed as shown in FIG. 7. The surface of the transparent anode 11a is washed sequentially by neutral detergent washing, acetone washing, IPA (isopropyl alcohol) washing, and UV ozone washing. Purposes of these washing processes include removal of contamination on transparent anode 11a, decrease of oxygen defects on the surface of transparent anode 11a, and reduction of hole injection barrier. In particular, UV ozone washing can eliminate contamination by organic matter that cannot be removed by wet process washing.

In the insulating layer forming process shown in FIG. 8, the whole area of forming light receiving element 11 on the glass substrate 10 is coated with cyclo-olefin polymer (3 wt. % tetralin solvent) by using spin coat method, dip method, curtain coat method, bar coat method, printing method, or ink jet method, and an insulating layer 11b is formed. Thickness of insulating layer 11b is enough to maintain insulation between transparent anodes 11a, and considering the liquid drop diameter of ink jet (drop diameter), a smaller thickness is preferred for the sake of higher resolution and higher quality. Since the insulating layer 11b is dissolved in a subsequent process, it is preferred to be in semi-cured state (not cured completely).

Preparation of ink solution 21 composed of components of organic film (light absorbing composition) and organic solvent is explained. In this embodiment, ink solution 21 is prepared by using pyrazoline derivative (P-1) which is light absorbing composition, and chloroform solvent (1 wt. %.) which is organic solvent. Viscosity of ink solution 21 is in a range of $5 \times 10^{-3}$ to $1.5 \times 10^{-2}$ Pa.s, and surface tension of ink solution 21 is in a range of 20 to 50 mN/m.

In the ink solution applying process shown in FIG. 9, the prepared ink solution 21 is selectively applied at 15 positions for forming pixels on the insulating layer 11b by using an ink jet head 30. This ink jet head 30 is a piezoelectric element type ink jet head having piezoelectric element 30a as shown in FIG. 12, and is designed to discharge drops of ink solution 21 from an orifice 30b formed in an ink jet head main body 30d depending on a signal from a driver 30c. Herein, discharge drive frequency is 1 kHz, and volume suitable for one drop is 40 to 50 uL. Accordingly, the drop diameter of ink solution 21 is 40 to 50 um, and one drop of ink solution 21 sticking to the insulating layer 11b spreads slightly in radial direction, and becomes 60 to 70 um.

In the light receiving part forming process shown in FIG. 10, at the applied positions of ink solution 21, the insulating layer 11b is dissolved by the chloroform solvent contained in the applied ink solution 21. As a result, dissolved holes are formed in the insulating layer 11b, and the ink solution 21 reaches up to the transparent anode 11a. By drying for 30 minutes at 50 to 60 deg. C., the chloroform solvent in the ink solution 21 is evaporated, and the dissolved holes are filled with pyrazoline derivative (P-1) which is nonvolatile component in the ink solution 21, and it is solidified while keeping electrical connection with the transparent anode 11a. The organic film formed of this solidified pyrazoline derivative (P-1) is the light receiving part 11c.

These 15 solidified light receiving parts 11c correspond to 15 pixels individually. At this time, as shown in FIG. 10, the insulating layer 11b dissolved by the ink solution 21 segregates in peripheral areas of dropped positions of ink solution 21, and the pyrazoline derivative (P-1) contained in the ink solution 21 is solidified in the center of dropped positions of ink solution 21. The reason is estimated that the pyrazoline derivative (P-1) is larger than the insulating layer 11b in the solubility in chloroform solvent contained in the ink solution 21. The insulating layer 11b in the area not coated with ink solution 21 is not dissolved but is left over, and becomes partition walls 11d for isolating the light receiving parts 11c.

Finally, in the second electrode forming process shown in FIG. 11, an Al film is formed by vacuum deposition method according to a specified pattern, and a reflection cathode 11e is formed. At this time, thickness of Al layer is 1000 Å.

Thus, the light receiving element 11 is formed in the center (on the switching TFT 12) of the glass substrate 10, and the horizontal address circuit 13 and the vertical address circuit 14 are formed in the peripheral area of the glass substrate 10. Further, by covering the light receiving element 11, switching TFT 12, horizontal address circuit 13, and vertical address circuit 14 by sealing layer 16, a Schottky type organic photodiode 1 is completed. This sealing layer 16 is made of glass plate, and its lower side (lower side in FIG. 1) has a gap of 0.3 to 0.5 mm to the light receiving element 11, and it is filled with desiccant. When fitting the sealing layer 16, its gap is packed with nitrogen gas.

Figure 13:
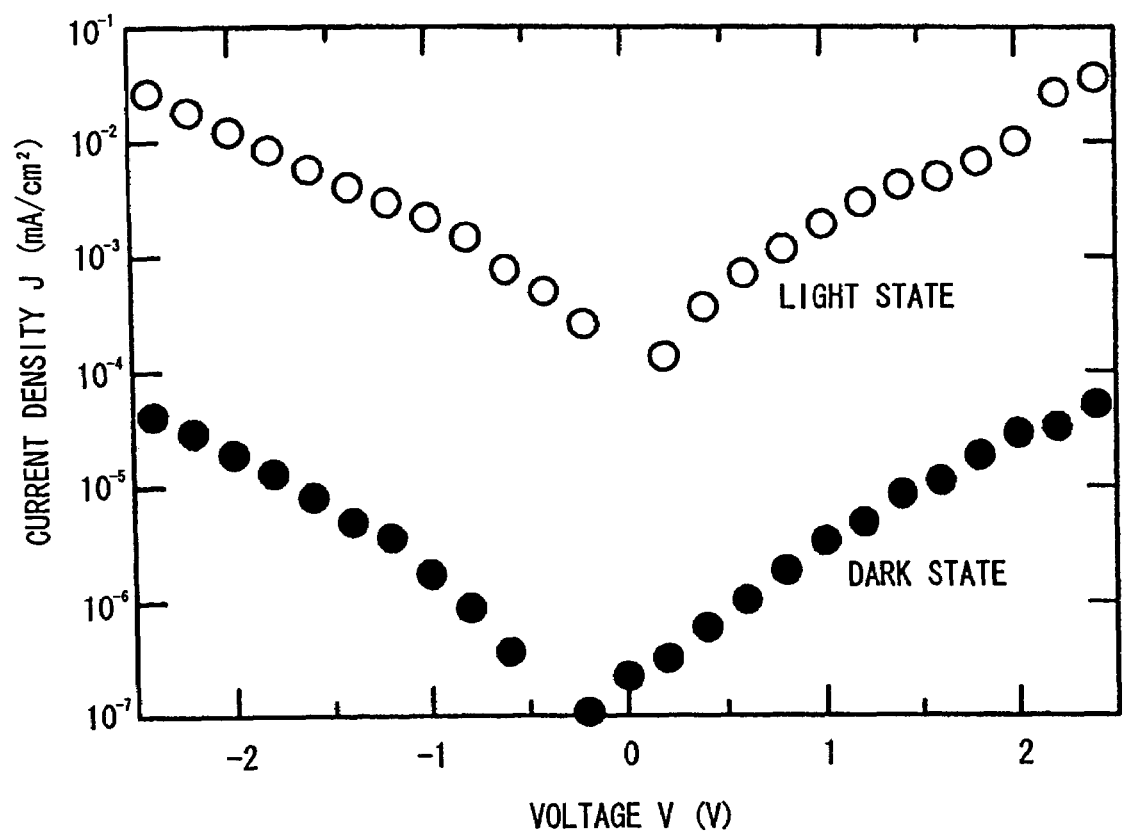
FIG. 13 is a graph showing characteristics of organic photodiode 1.

Performance evaluation of the organic photodiode 1 is explained. FIG. 13 is a graph of characteristics of organic photodiode 1, showing the relation between voltage and current density in light state of organic photodiode 1 receiving light and dark state not receiving light. To measure the performance of organic photodiode 1, xenon lamp (33 mW/cm$^2$) is used as light source, in forward bias of transparent anode 11a (+) and reflection cathode 11e (−). As a result, as shown in FIG. 13, an photo current of $10^{-2}$ mA/cm$^2$, and a conductive ratio of about $10^3$ in light state and dark state are obtained. Therefore, the organic photodiode 1 of the present invention is evaluated to exhibit a high sensing performance as photodiode using organic material.

As described herein, according to the organic photodiode 1 of the first embodiment and its manufacturing method, by applying the ink solution 21 containing light absorbing composition and organic solvent to positions for forming pixels on the insulating layer 11b, the light receiving parts 11c and the partition walls 11d are formed at the same time. Hence, the layer of light absorbing composition composed of organic material is formed accurately, and the organic photodiode 1 of high quality realizing decrease of dark current and high sensing performance is presented. Unlike the prior art, there is no independent process of exposure or etching, etc. for forming the partition wall lid between light receiving parts 11c, the manufacturing process of organic photodiode 1 is shortened, and the manufacturing cost can be lowered.

Besides, by employing the piezoelectric element method as ink jet head 30, unlike Bubble Jet (registered trademark) method, there is no heat source for discharging ink, and ink material does not deteriorate, the selection range of solvent for ink solution 21 is wide, control of dropping volume of discharging ink solution 21 is easy, the driving frequency is high, and the durability is high, among many advantages. Further, by using the ink jet, as compared with full surface forming method by vapor deposition or the like, dots (pixels) can be formed at arbitrary position by self-matching.

A second embodiment of organic photodiode and its manufacturing method of the present invention is described specifically below while referring to accompanying drawing. An organic photodiode 1 of the embodiment is a Schottky type organic photodiode having a transparent anode on one side and a non-transparent reflection cathode on the other side, with hole transport layer formed at the transparent anode side.

Figure 14:
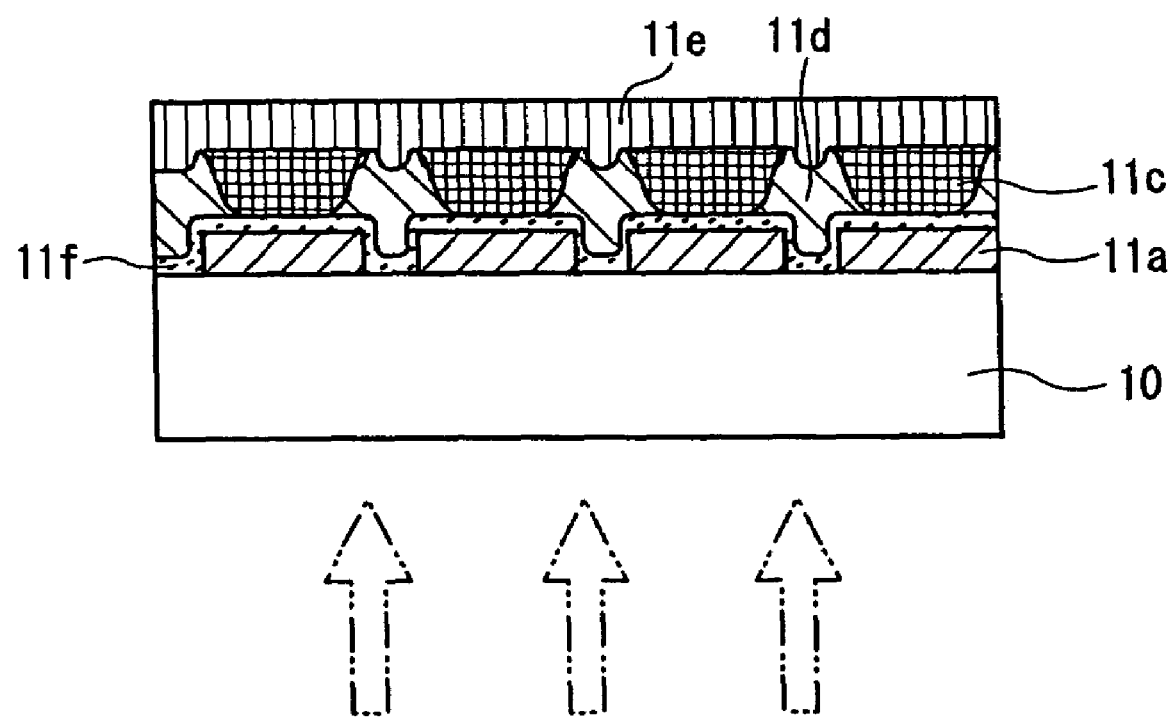
FIG. 14 is a partial sectional view of organic photodiode 1 in second embodiment.

Configuration of organic photodiode 1 of this embodiment is explained. FIG. 14 is a partial sectional view of organic photodiode 1 in the second embodiment. Same parts as in the first embodiment are identified with same reference numerals.

Studying for higher performance of organic photodiode 1, it may be considered to enhance the sensing performance by forming multiple layers of hole transport material mainly around the light receiving parts 11c formed by light absorbing composition. In this embodiment, accordingly, a hole transport layer 11f is formed between the transparent anode 11a and light receiving part 11c as shown in FIG. 14. The hole transport layer 11f is a layer for receiving a hole from the light receiving part 11c and transporting up to the transparent anode 11a, and it is formed of hole transport material. The hole transport material is also a light absorbing composition for forming a layer exhibiting light receiving function together with the light receiving part 11c.

In this embodiment, since the hole transport layer 11f is formed in the lower part of the light receiving part 11c, it is required to have a property not dissolving in the light absorbing composition contained in the ink solution 21 applied in the ink solution applying process (see FIG. 9). In this embodiment, hence, as hole transport material, poly (ethylene dioxythiophene)/poly(styrene sulfonate) (PEDOT) is used.

An embodiment of manufacturing method of organic photodiode 1 in this embodiment is explained. This manufacturing method is basically same as in the first embodiment, except that a first transport layer forming process is added.

First, in the first electrode forming process, ITO is evaporated on a glass substrate 10 in a thickness of 150 nm by magnetron sputtering method, and a desired electrode pattern is formed, so that a transparent anode 11a is formed. Further, in the first transport layer forming process, as hole transport material, PEDOT (Bayer) is applied by spin coat method to cover the surface of glass substrate 10 from above the transparent electrode 11a, and this PEDOT film is baked for an hour at 200 deg. C. in vacuum, and a hole transport layer 11f is formed. In the next insulating layer forming process, the hole transport layer 11f is coated with cyclo-olefin polymer (3 wt. % tetralin solvent) by spin coat method, and an insulating layer 11b is formed. In the ink solution applying process, an ink solution 21 is applied selectively on the insulating layer 11b by using an ink jet head 30. This ink solution 21 is prepared same as in the first embodiment.

In the light receiving part forming process, the insulating layer 11b is dissolved by the chloroform solvent contained in the applied ink solution 21, and the light receiving parts 11c and the partition walls 11d are formed. The light receiving parts 11c are organic film formed by pyrazoline derivative (P-1) solidified while keeping electrical connection with the hole transport layer 11f. Finally, in the second electrode forming process, an Al film is formed by vacuum deposition method according to a specified pattern, and a reflection cathode 11e is formed. By this process, a Schottky type organic photodiode 1 is manufactured, with the hole transport layer 11f formed at the transparent anode 11a side.

As described herein, according to the organic photodiode 1 of the second embodiment and its manufacturing method, by forming the hole transport layer 11f at the transparent anode 11a side, the light receiving parts 11c and hole transport layer 11f are joined integrally to exhibit light receiving function, and a higher sensing performance is exhibited, and a higher performance of organic photodiode 1 is realized.

A third embodiment of organic photodiode and its manufacturing method of the present invention is described specifically below while referring to accompanying drawing. An organic photodiode 1 of the embodiment is a Schottky type organic photodiode having a transparent anode on one side and a non-transparent reflection cathode on the other side, with electron transport layer formed at the reflection cathode side.

Figure 15:
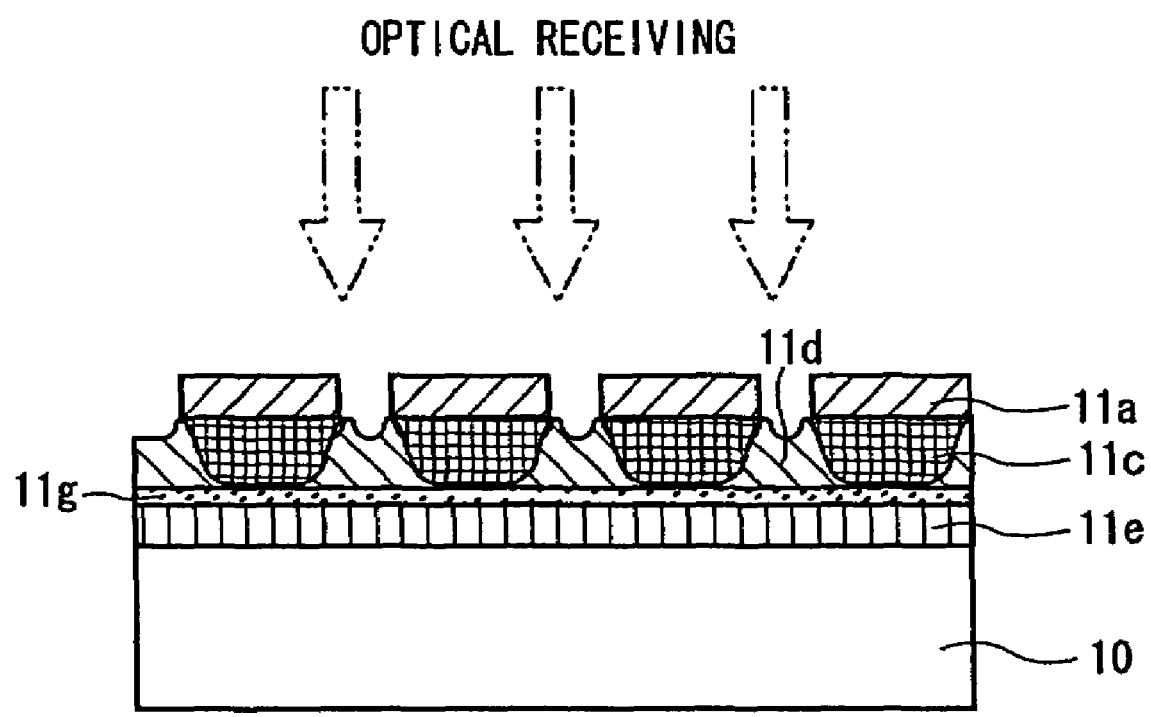
FIG. 15 is a partial sectional view of organic photodiode 1 in third embodiment.

Configuration of organic photodiode 1 of this embodiment is explained. FIG. 15 is a partial sectional view of organic photodiode 1 in the third embodiment. Same parts as in the second embodiment are identified with same reference numerals.

Studying for higher performance of organic photodiode 1, it may be considered to enhance the sensing performance by forming multiple layers of electron transport material mainly around the light receiving parts 11c formed by light absorbing composition. In this embodiment, accordingly, an electron transport layer 11g is formed between the reflection cathode 11e and the light receiving part 11c as shown in FIG. 15. The electron transport layer 11g is a layer for receiving an electron from the light receiving part 11c and transporting up to the reflection cathode 11e, and it is formed of electron transport material. The electron transport material is also a light absorbing composition for forming a layer exhibiting light receiving function together with the light receiving part 11c.

In this embodiment, since the electron transport layer 11g is formed in the lower part of the light receiving part 11c, it is required to have a property not melting out into the light absorbing composition contained in the ink solution 21 applied in the ink solution applying process (see FIG. 9). In this embodiment, hence, as electron transport material, 2,9-dimethyl-4,7-diphenyl-1,10, phenanthroline (BCP) is used.

An embodiment of manufacturing method of organic photodiode 1 in this embodiment is explained. This manufacturing method is basically same as in the second embodiment, except that a reflection cathode 11e is formed at the lower side of the light receiving part 11c, and that a transparent anode 11a is formed at the upper side of the light receiving part 11c. Therefore, it is different from the second embodiment that the execution sequence of first electrode forming process (see FIG. 6 and FIG. 7) for forming the transparent anode 11a and the second- electrode forming process (see FIG. 11) for forming the reflection cathode 11e is different, and that the second transport layer forming process is additionally provided.

In the second electrode forming process, an Al film is formed on the glass substrate 10 in specified pattern by vacuum deposition method, and a reflection cathode 11e is formed. In the subsequent second transport layer forming process, as electron transport material, BCP is applied by spin coat or vacuum deposition method to cover the surface of the glass substrate 10 from above the reflection cathode 11e, and an electron transport layer 11g is formed. In the next insulating layer forming process, the electron transport layer 11g is coated with cyclo-olefin polymer (3 wt. % tetralin solvent) by spin coat method, and an insulating layer 11b is formed. In the ink solution applying process, an ink solution 21 is applied selectively on the insulating layer 11b by using an ink jet head 30. This ink solution 21 is prepared same as in the second embodiment.

In the light receiving part forming process, the insulating layer 11b is dissolved by the chloroform solvent contained in the applied ink solution 21, and the light receiving parts 11c and the partition walls 11d are formed. The light receiving parts 11c are organic film formed by pyrazoline derivative (P-1) solidified while keeping electrical connection with the electron transport layer 11g. Finally, in the first electrode forming process, an ITO is evaporated in a thickness of 150 nm by magnetron sputtering method, and a specified electrode pattern is formed, and a transparent anode 11a is formed. By this process, a Schottky type organic photodiode 1 is manufactured, with the electrode transport layer 11g formed at the reflection cathode 11e side. The organic photodiode 1 of the embodiment is designed to receive light from the direction of forming the transparent anode 11a (upward direction in FIG. 15), not from the glass substrate 10 side, to execute optical sensing.

As described herein, according to the organic photodiode 1 of the third embodiment and its manufacturing method, by forming the electron transport layer 11g at the reflection cathode 11e side, the light receiving parts 11c and the electron transport layer 11g are joined integrally to exhibit light receiving function, and a higher sensing performance is exhibited, and a higher performance of organic photodiode 1 is realized.

A fourth embodiment of organic photodiode and its manufacturing method of the present invention is described specifically below while referring to accompanying drawing. An organic photodiode 1 of the embodiment is a Schottky type organic photodiode having a transparent anode on one side and a non-transparent reflection cathode on the other side, with hole transport layer formed at the transparent anode side and the electron transport layer formed at the reflection cathode side.

Figure 16:
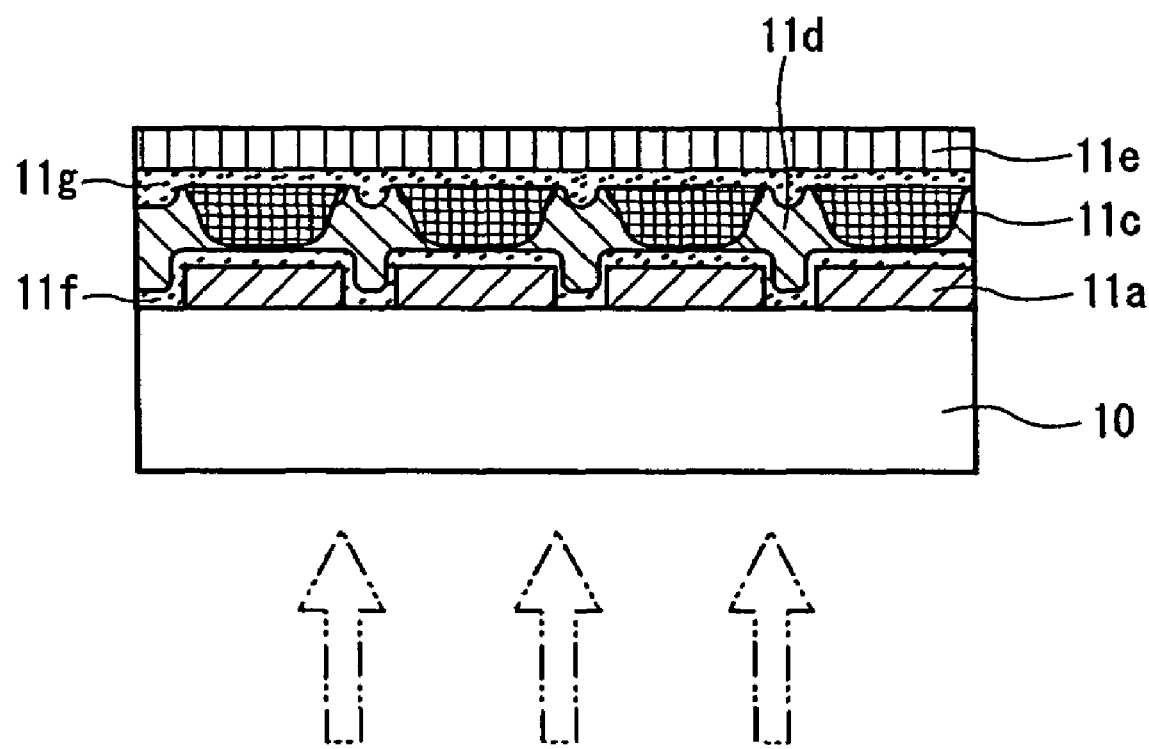
FIG. 16 is a partial sectional view of organic photodiode 1 in fourth embodiment.

Configuration of organic photodiode 1 of this embodiment is explained. FIG. 16 is a partial sectional view of organic photodiode 1 in the fourth embodiment. Same parts as in the second or third embodiment are identified with same reference numerals.

Studying for higher performance of organic photodiode 1, it may be considered to enhance the sensing performance by forming multiple layers of hole transport material and electron transport material mainly around the light receiving parts 11c formed by light absorbing composition. In this embodiment, accordingly, a hole transport layer 11f is formed between the transparent anode 11a and the light receiving part 11c, and an electrode transport layer 11g is formed between the reflection cathode 11e and the light receiving part 11c as shown in FIG. 16.

An embodiment of manufacturing method of organic photodiode 1 in this embodiment is explained. This manufacturing method is basically same as in the second embodiment, except that a second transport layer forming process is additionally provided.

First, in the first electrode forming process, ITO is evaporated on a glass substrate 10 in a thickness of 150 nm by magnetron sputtering method, and a desired electrode pattern is formed, so that a transparent anode 11a is formed. Further, in the first transport layer forming process, as hole transport material, PEDOT (Bayer) is applied by spin coat method to cover the surface of glass substrate 10 from above the transparent anode 11a, and this PEDOT film is baked for an hour at 200 deg. C. in vacuum, and a hole transport layer 11f is formed. In the next insulating layer forming process, the hole transport layer 11f is coated with cyclo-olefin polymer (3 wt. % tetralin solution) by spin coat method, and an insulating layer 11b is formed. In the ink solution applying process, an ink solution 21 is applied selectively on the insulating layer 11b by using an ink jet head 30. This ink solution 21 is prepared in the same manner as in the second embodiment.

In the light receiving part forming process, the insulating layer 11b is dissolved by the chloroform solvent contained in the applied ink solution 21, and the light receiving parts 11c and the partition walls 11d are formed. The light receiving parts 11c are organic films formed by pyrazoline derivative (P-1) solidified while keeping electrical connection with the hole transport layer 11f. In the second transport layer forming process, BCP of electron transport material is applied from above to coat the light receiving parts 11c and the partition walls 11d by spin coat method or vacuum deposition method, and an electron transport layer 11g is formed. Finally, in the second electrode forming process, an Al film is formed by vacuum deposition method according to a specified pattern, and a reflection cathode 11e is formed. By this process, a Schottky type organic photodiode 1 is manufactured, with the hole transport layer 11f formed at the transparent anode 11a side, and the electron transport layer 11g formed at the reflection cathode 11e side.

As described above, according to the organic photodiode 1 of the fourth embodiment and its manufacturing method, by forming the hole transport layer 11f at the transparent anode 11a side, and forming the electron transport layer 11g at the reflection cathode 11e side, the light receiving parts 11c and the hole transport layer 11f and the electron transport layer 11g are joined integrally to exhibit light receiving function, and a higher sensing performance is exhibited, and a higher performance of organic photodiode 1 is realized.

A fifth embodiment of organic photodiode and its manufacturing method of the present invention is described specifically below while referring to accompanying drawing. An organic photodiode 1 of the embodiment is a Schottky type organic photodiode having a transparent anode on one side and a non-transparent reflection cathode on the other side, with hole transport layer and mixed layer formed at the transparent anode side.

Figure 17:
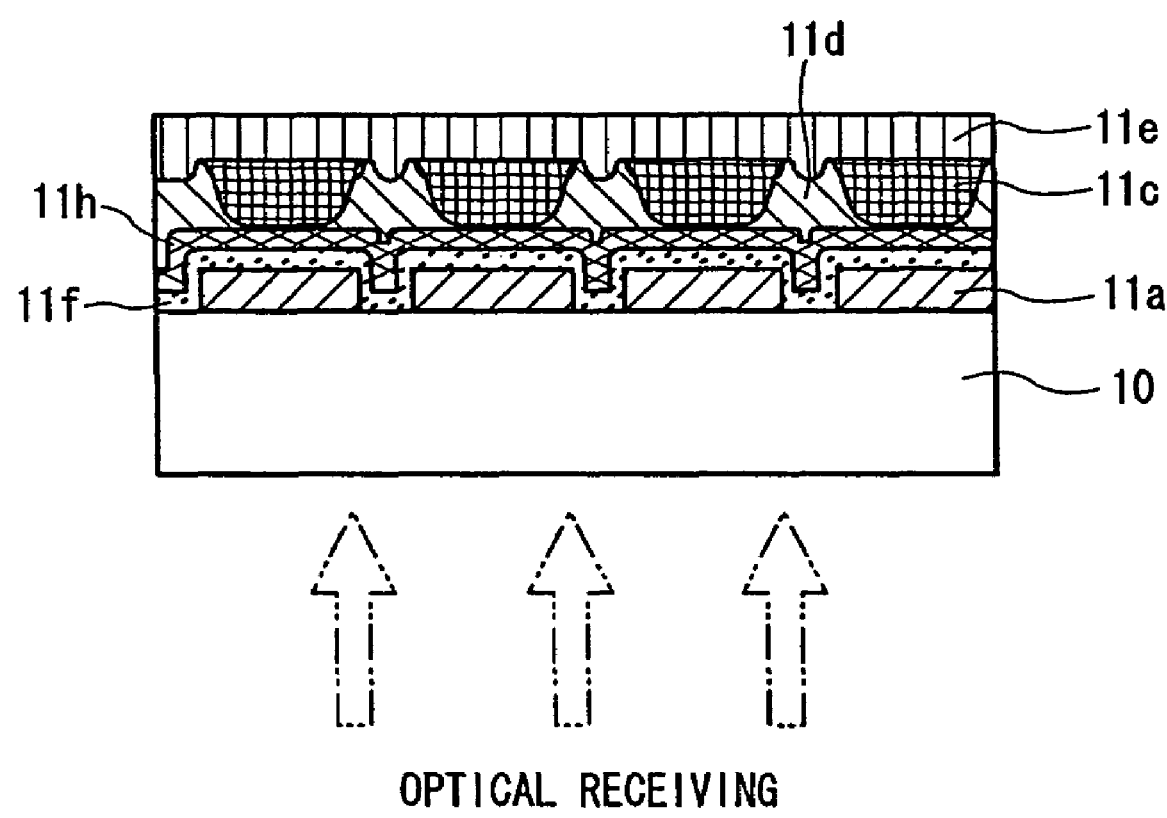
FIG. 17 is a partial sectional view of organic photodiode 1 in fifth embodiment.

Configuration of organic photodiode 1 of this embodiment is explained. FIG. 17 is a partial sectional view of organic photodiode 1 in the fifth embodiment. Same parts as in the second embodiment are identified with same reference numerals.

Studying for higher performance of organic photodiode 1, it may be considered to enhance the dielectric strength by forming a mixed layer of hole transport material and light absorbing composition. In this embodiment, accordingly, a mixed layer 11h is formed between a hole transport layer 11f and light receiving part 11c as shown in FIG. 17.

An embodiment of manufacturing method of organic photodiode 1 in this embodiment is explained by referring to FIG. 17. This manufacturing method is basically same as in the second embodiment, except that a mixed layer forming process is additionally provided.

First, in the first electrode forming process, ITO is evaporated on a glass substrate 10 in a thickness of 150 nm by magnetron sputtering method, and a desired electrode pattern is formed, so that a transparent anode 11a is formed. Further, in the first transport layer forming process, as hole transport material, copper phthalocyanine (CuPc) is applied by spin coat method to cover the surface of glass substrate 10 from above the transparent anode 11a, and a hole transport layer 11f is formed. In the mixed layer forming process, a mixed material of copper phthalocyanine (CuPc) and perylene derivative (td-PTC) is applied by spin coat method to coat the hole transport layer 11f, and a mixed layer 11h is formed.

In the next insulating layer forming process, the mixed layer 11h is coated with cyclo-olefin polymer (3 wt. % tetralin solution) by spin coat method, and an insulating layer 11b is formed. In the ink solution applying process, an ink solution 21 is applied selectively on the insulating layer 11b by using an ink jet head 30. The ink solution 21 of this embodiment is prepared by using perylene derivative (td-PTC) as light absorbing composition and chloroform solvent (1 wt. %) as organic solvent.

In the light receiving part forming process, the insulating layer 11b is dissolved by the chloroform solvent contained in the applied ink solution 21, and the light receiving parts 11c and the partition walls 11d are formed. The light receiving parts 11c are organic films formed by perylene derivative (td-PTC) solidified while keeping electrical connection with the mixed layer 11h. Finally, in the second electrode forming process, an Al film is formed by vacuum deposition method according to a specified pattern, and a reflection cathode 11e is formed. By this process, a Schottky type organic photodiode 1 is manufactured, with the hole transport layer 11f and mixed layer 11h formed at the transparent anode 11a side.

The performance is compared between the organic photodiode 1 of the embodiment manufactured in this process (hereinafter called organic photodiode 1A), and the organic photodiode 1 of the second embodiment not having mixed layer 11h (hereinafter called organic photodiode 1B). In the light receiving element 11 of the organic photodiode 1A, three layers of the hole transport layer 11f (CuPc: 30 nm), the mixed layer 11h (CuPc+td-PTC: 30 nm), and the light receiving part 11c (td-PTC: 30 nm) are laminated (90 nm). In the light receiving element 11 of the organic photodiode 1B, two layers of the hole transport layer 11f (CuPc: 50 nm) and the light receiving part 11c (td-PTC: 30 nm) are laminated (80 nm).

In the organic photodiodes 1A and 1B, the dielectric strengths are respectively evaluated by gradually increasing the driving voltage by the switching TFT 12. As a result, the organic photodiode 1B recorded a dielectric strength of 2V to 3 V, while the organic photodiode 1A recorded an improved high dielectric strength of about 10 V. This is because the mixed layer 11h is provided in the organic photodiode 1A, and the dielectric strength is improved, and compatibility of driving voltage with other organic-device is assured.

As described above, according to the organic photodiode 1 of the fifth embodiment and its manufacturing method, by forming the mixed layer 11h between the hole transport layer 11f and the light receiving part 11c, the hole transport layer 11f and the mixed layer 11h are joined integrally with the light receiving part 11c to exhibit light receiving function, and a higher dielectric strength is exhibited, and a higher performance of organic photodiode 1 is realized.

Figure 18:
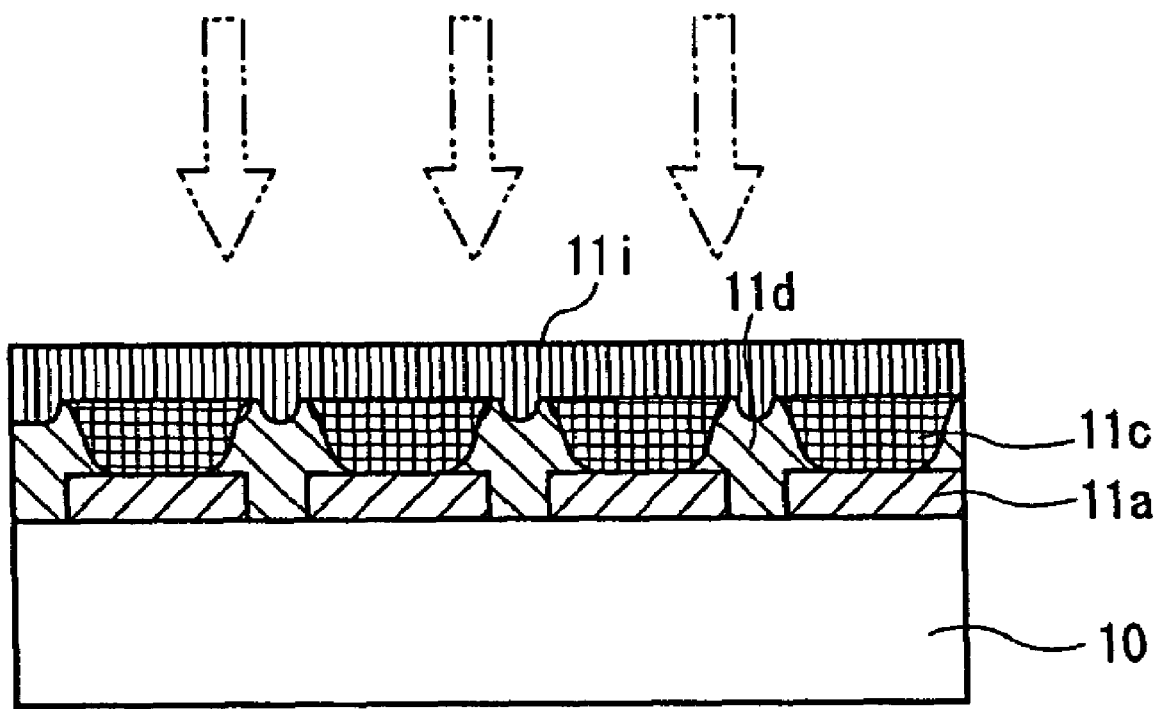
FIG. 18 is a partial sectional view of organic photodiode 1 in sixth embodiment.
Figure 19:
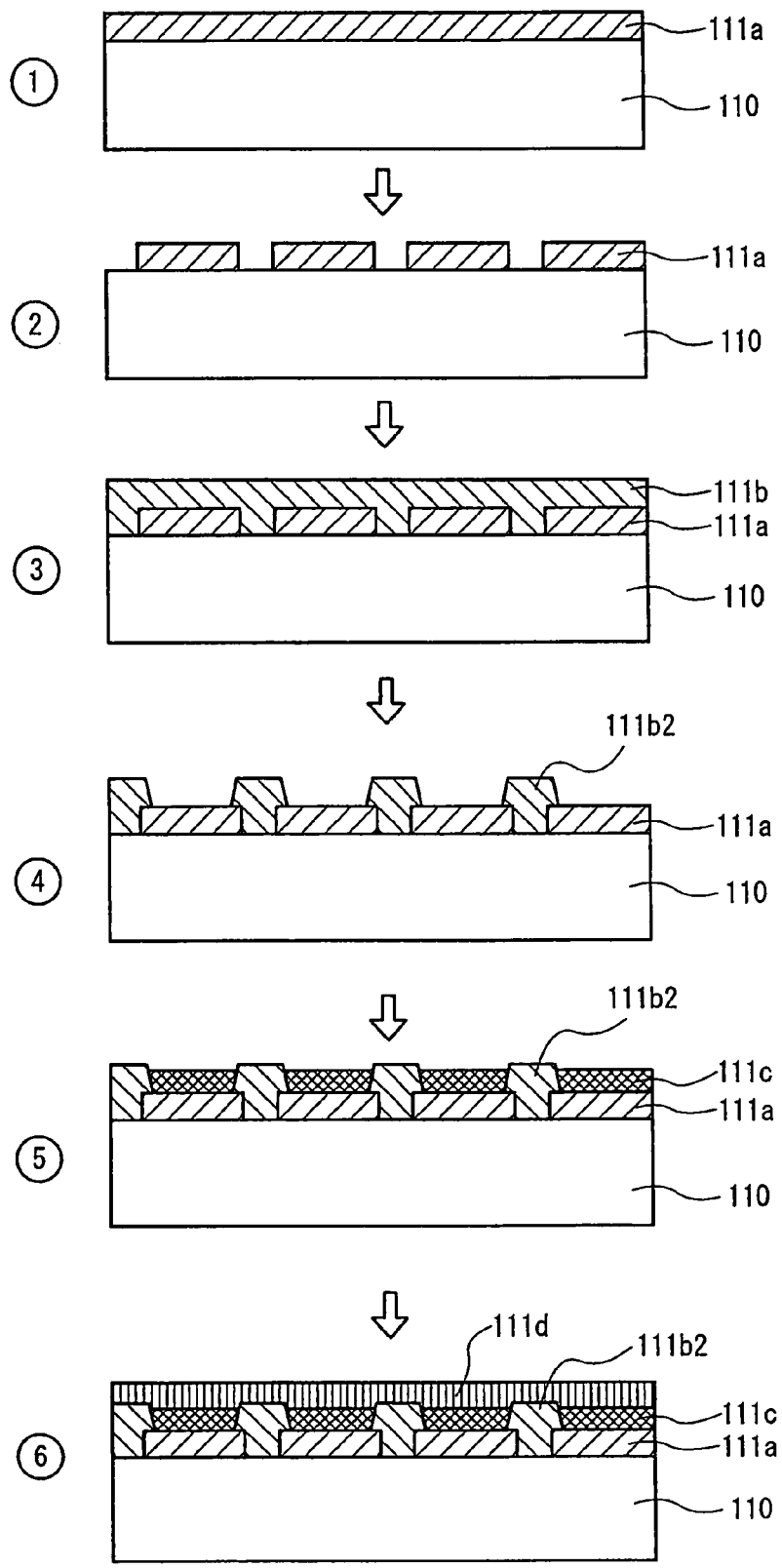
FIG. 19 is a diagram explaining an conventional manufacturing method of organic EL element.

A sixth embodiment of organic photodiode and its manufacturing method of the present invention is described specifically below while referring to accompanying drawings. An organic photodiode 1 of the embodiment is a Schottky type organic photodiode having transparent cathodes formed on both sides. FIG. 18 is a partial sectional view of the organic photodiode 1 in the sixth embodiment. Same parts as in the first embodiment are identified with same reference numerals.

As shown in FIG. 18, the organic photodiode 1 of the embodiment has transparent cathodes 11i instead of reflection cathodes 11e. The transparent cathode 11i is a transparent electrode capable of assuring high work function and transparency, and it is made of $MgO_3$ (magnesium peroxide). This organic photodiode 1 receives light not only from the glass substrate 10 side, but also from the transparent cathode 11i side (upper direction in FIG. 18), and is designed to execute optical sensing. To manufacture such organic photodiode 1, in the second electrode forming process, a transparent cathode 11i is formed by forming a film of $MgO_3$ (magnesium peroxide) according to a specified pattern by vacuum deposition method.

As described above, according to the organic photodiode 1 of the sixth embodiment and its manufacturing method, by forming the transparent anodes 11a and the transparent cathodes 11i, the light is received from both sides of the organic photodiode 1, so that the light receiving region of the organic photodiode 1 is extended.

Embodiments of the present invention are described herein, but the present invention is not limited to the illustrated embodiments alone, but may be changed and modified in various forms. For example, the present invention may be realized by properly combining the organic photodiodes 1 of the first to sixth embodiments. That is, the organic photodiode 1 capable of receiving light from both sides of the sixth embodiment may be combined with any one or a plurality of members of hole transport layer 11f, electron transport layer 11g, and mixed layer 11h in the second to fifth embodiments. Depending on mounting or specification of the organic photodiode 1, the hole transport layer 11f, electron transport layer 11g, or mixed layer 11h, etc. may be formed as desired on each electrode.

As explained in the third embodiment, a transparent electrode may be formed at a side of the light receiving part 11c opposite to the glass substrate 10, or as explained in the sixth embodiment, transparent electrodes may be formed at both sides of the light receiving part 11c. That is, depending on mounting or specification of the organic photodiode 1, transparent electrode or reflection electrode may be formed in arbitrary direction in the light receiving part 11c, and any electrode may be either anode or cathode.

Materials for forming electrodes of transparent anode 11a, reflection cathode 11e, and transparent cathode 11i, and materials for light absorbing composition, organic solvent, insulating material, hole transport material, and electron transport material are not limited to those shown in the embodiments, but depending on mounting or specification of the organic photodiode 1, or considering reaction performance and other properties of materials, combination of optimum materials may be freely selected, and the organic photodiode 1 of the present invention can be composed.

The organic photodiode and its manufacturing method of the present invention can be applied in photodiode for executing optical sensing and its manufacturing method.

What is claimed is:

1. An organic photodiode comprising:
   a pair of electrodes that is disposed oppositely to each other,
   a substrate that forms one electrode of the pair of electrodes,
   a plurality of light receiving parts as layers of light absorbing composition that is disposed in a gap of the pair of electrodes, and
   partition walls that is formed in a gap of the pair of electrodes for insulating between the pair of electrodes and insulating between the light receiving part and the other light receiving part,
   wherein the partition walls are formed at a position corresponding to one electrode on an insulating layer covering the one electrode and its surrounding, by applying an ink solution containing a solvent for dissolving the insulating layer and the light absorbing composition, evaporating the solvent in the ink solution after dissolving the insulating layer, and forming a plurality of dissolved holes as spaces contacting with this one electrode, and
   the plurality of light receiving parts are formed by filling the plurality of dissolved holes with the light absorbing composition in the ink solution.

2. The organic photodiode according to claim 1, wherein the substrate is a transparent material, and one electrode of the pair of electrodes is a transparent electrode, and the other electrode of the pair of electrodes is a non-transparent reflection electrode.

3. The organic photodiode according to claim 1, wherein one electrode of the pair of electrodes is a non-transparent reflection electrode, and the other electrode of the pair of electrodes is a transparent electrode.

4. The organic photodiode according to claim 1, wherein the substrate is a transparent material, and one electrode of the pair of electrodes is a transparent electrode, and the other electrode of the pair of electrodes is a transparent electrode.

5. The organic photodiode according to claim 1, wherein the light absorbing composition is a mixture of two or more organic materials.

6. The organic photodiode according to claim 1, wherein between the anode of the pair of electrodes and the light receiving parts, a hole transport layer is formed by using a material having an insoluble property in the solvent of the ink solution and having at least hole transport property.

7. The organic photodiode according to claim 1, wherein between the cathode of the pair of electrodes and the light receiving parts, an electron transport layer is formed by using a material having an insoluble property in the solvent of the ink solution and having at least electron transport property.

8. The organic photodiode according to claim 1, wherein the light absorbing composition contains perylene derivative or pyrazoline derivative.

9. The organic photodiode according to claim 8, wherein the perylene derivative is N,N'-ditridecyl-3,4,9, 10-perylene-tetracarboxylic-diimide.

10. The organic photodiode according to claim 8, wherein the perylene derivative is N,N'-bis (2,5-di-tert-butyl phenyl)-3,4,9,10-perylene dicarboximide.

11. The organic photodiode according to claim 8, wherein the pyrazoline derivative is 4-[2-[5-[4-(diethylamino) phenyl]-4,5-dihydro-1-phenyl-1H-pyrazole-3-yl]-ethenyl]-N,N-diethyl aniline.

12. The organic photodiode according to claim 1, wherein the insulating layer is composed of cyclo-olefin polymer.

13. A manufacturing method of organic photodiode, being a method for manufacturing an organic photodiode comprising a pair of electrodes disposed oppositely to each other, a substrate forming one electrode of the pair of electrodes, a plurality of light receiving parts as layers of light absorbing composition disposed in a gap of the pair of electrodes, and partition walls formed in a gap of the pair of electrodes for insulating between the pair of electrodes and insulating between the light receiving part and the other light receiving part, comprising:
   a first electrode forming process that forms the one electrode on the substrate,
   an insulating layer forming process that forms an insulating layer covering the one electrode and its surrounding,
   an ink solution applying process that applies an ink solution containing a solvent for dissolving the insulating layer and the light absorbing composition on a portion of the insulating layer at a position corresponding to the one electrode,
   a light receiving part forming process that forms the plurality of light receiving parts by evaporating the solvent in the ink solution after dissolving the insulating layer, thereby forming a plurality of holes as spaces contacting with the one electrode that are filled by the light absorbing composition of the ink solution once the solvent and dissolved insulating material is evaporated, and
   a second electrode forming process that forms other electrode of the pair of electrodes on the plurality of light receiving parts.

14. The manufacturing method of organic photodiode according to claim 13,
   wherein the substrate is a transparent material, and one electrode of the pair of electrodes is a transparent electrode, and the other electrode of the pair of electrodes is a non-transparent reflection electrode.

15. The manufacturing method of organic photodiode according to claim 13,
   wherein one electrode of the pair of electrodes is a non-transparent reflection electrode, and the other electrode of the pair of electrodes is a transparent electrode.

16. The manufacturing method of organic photodiode according to claim 13,
   wherein the substrate is a transparent material, and one electrode of the pair of electrodes is a transparent electrode, and the other electrode of the pair of electrodes is a transparent electrode.

17. The manufacturing method of organic photodiode according to claim 13,
   wherein the light absorbing composition is a mixture of two or more organic materials.

18. The manufacturing method of organic photodiode according to claim 13,
   wherein the method further comprises a first transport layer forming process that forms a hole transport layer by using a material having an insoluble property in the solvent of the ink solution and having at least hole transport property, or an electron transport layer by using a material having an insoluble property in the solvent of the ink solution and having at least electron transport property, on the one electrode formed on the substrate in the first electrode forming process.

19. The manufacturing method of organic photodiode according to claim 13, wherein the method further comprises a second transport layer forming process that forms a hole transport layer by using a material having an insoluble property in the solvent of the ink solution and having at least hole transport property, or an electron transport layer by using a material having an insoluble property in the solvent of the ink solution and having at least electron transport property, on the plurality of light receiving parts formed in the receiving part forming process.

20. The manufacturing method of organic photodiode according to claim 13, wherein the light absorbing composition contains perylene derivative or pyrazoline derivative.

21. The manufacturing method of organic photodiode according to claim 20, wherein the perylene derivative is N,N'-ditridecyl-3,4,9,10-perylene-tetracarboxylic-diimide.

22. The manufacturing method of organic photodiode according to claim 20, wherein the perylene derivative is N,N'-bis (2,5-di-tert-butyl phenyl)-3,4,9,10-perylene dicarboximide.

23. The manufacturing method of organic photodiode according to claim 20, wherein the pyrazoline derivative is 4-[2-[5-[4-(diethylamino) phenyl]-4,5-dihydro-1-phenyl-1H-pyrazole-3-yl]-ethenyl]-N,N-diethyl aniline.

24. The manufacturing method of organic photodiode according to claim 13, wherein the insulating layer is composed of cyclo-olefin polymer.

* * * * *